United States Patent [19]

Ohyama et al.

[11] Patent Number: 5,751,373
[45] Date of Patent: May 12, 1998

[54] TELEVISION FUNCTION SELECTION METHOD, TELEVISION RECEIVER AND REMOTE COMMANDER FOR TELEVISION RECEIVER

[75] Inventors: Tomoko Ohyama, Kanagawa; Yukiko Ohkura, Tokyo; Masaharu Fukumoto; Shigeyuki Sano, both of Kanagawa; Yasuko Rokukawa, Tokyo; Shiro Endo, Chiba; Kyosuke Oda; Yumiko Minakawa, both of Kanagawa; Chifumi Matsuura, Tokyo, all of Japan

[73] Assignee: Sony Corporation, Tokyo, Japan

[21] Appl. No.: 623,112

[22] Filed: Mar. 28, 1996

[30] Foreign Application Priority Data

Mar. 31, 1995 [JP] Japan ................. 7-074892

[51] Int. Cl.$^6$ .............................. H04N 5/445
[52] U.S. Cl. ................. 348/569; 348/734; 348/564
[58] Field of Search .................... 348/563, 564, 348/569, 725, 734, 589, 600; H04N 5/445, 5/50, 9/74, 9/76

[56] References Cited

U.S. PATENT DOCUMENTS 5,539,479  7/1996  Bertram ..................... 348/564

Primary Examiner—Sherrie Hsia
Attorney, Agent, or Firm—Jay H. Maioli

[57] ABSTRACT

A method and apparatus by which function as of a television receiver can be selected simply. A main menu displays the highest level of a hierarchical menu which includes items corresponding to functions of a television receiver is displayed on a left side portion of a screen of the television receiver. When a cursor is moved to the first item of the main menu, while the main menu remains displayed on the screen, a sub menu corresponding to the first item is displayed on a right side portion of the screen. When the cursor is subsequently moved to one of the items forming the sub menu and then a predetermined operation is performed.

13 Claims, 22 Drawing Sheets

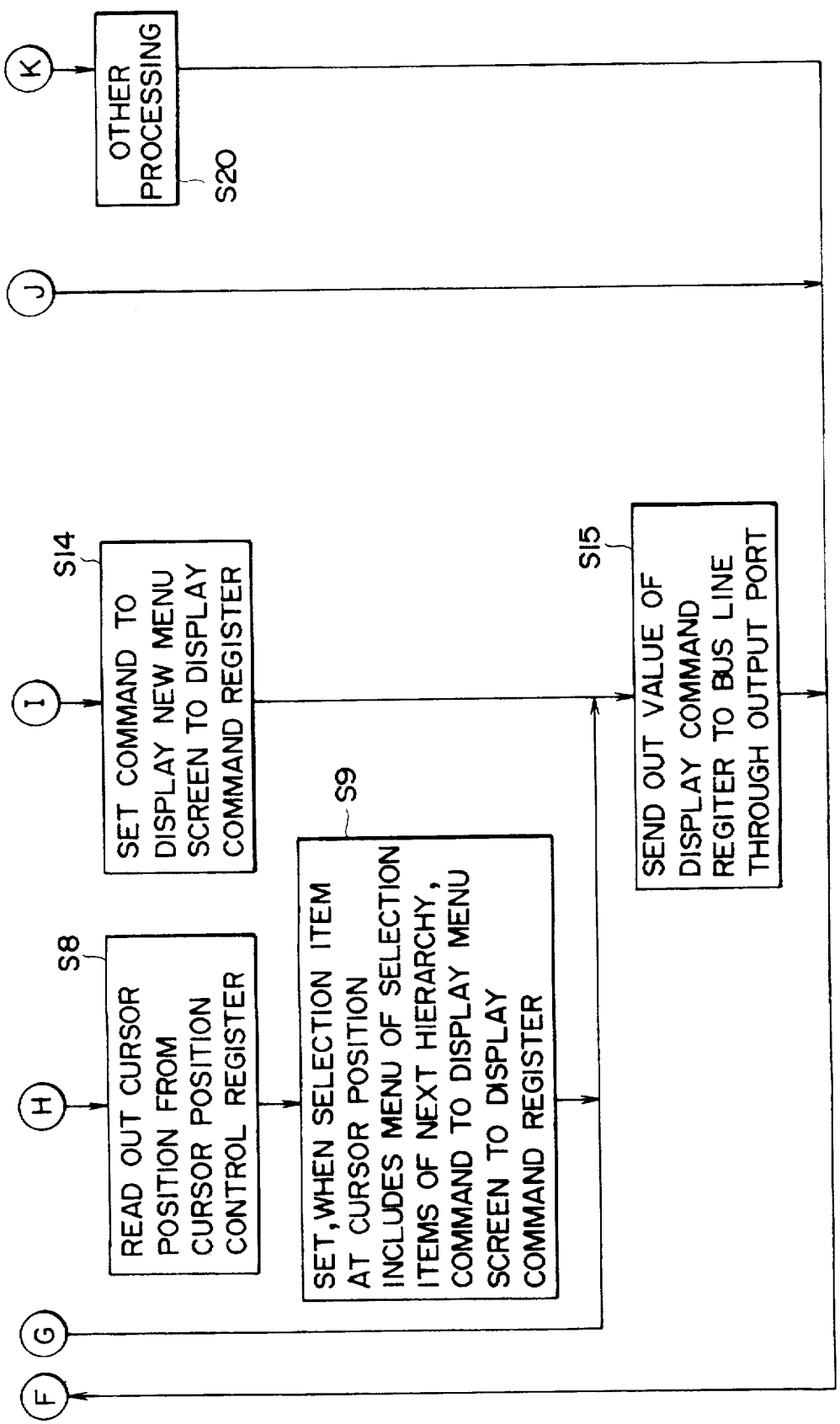

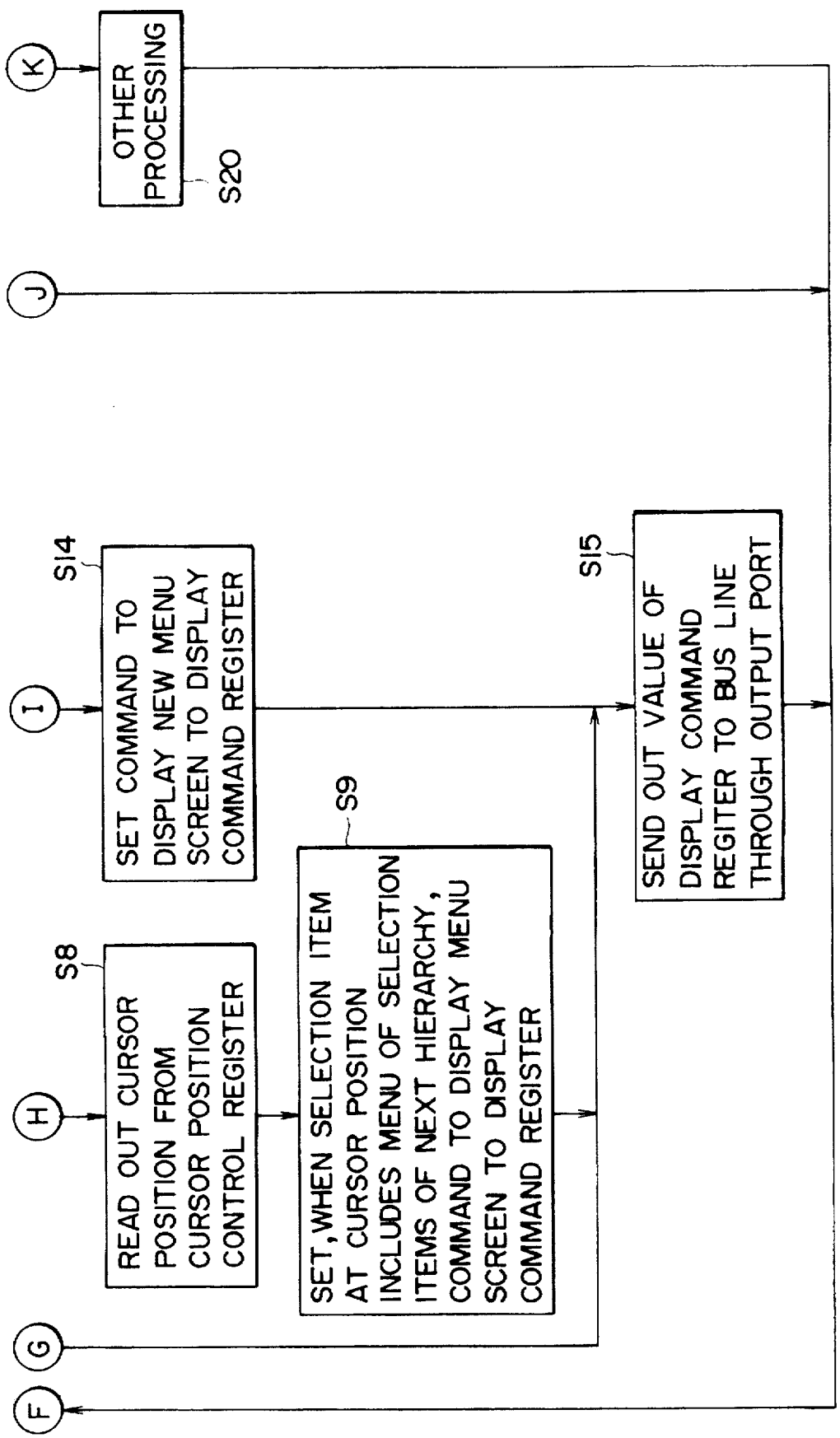

F I G. 3
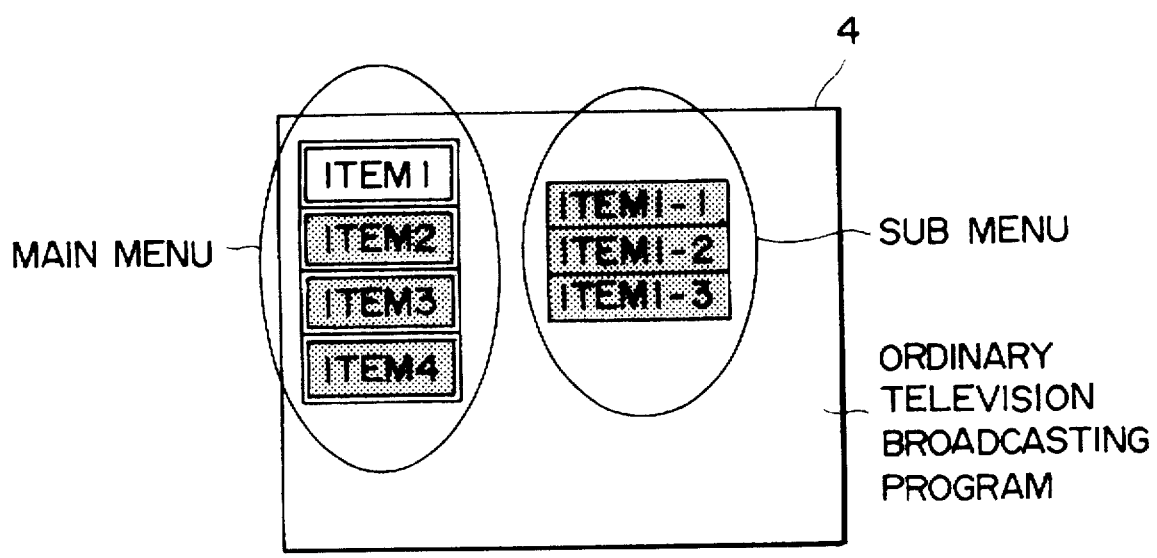

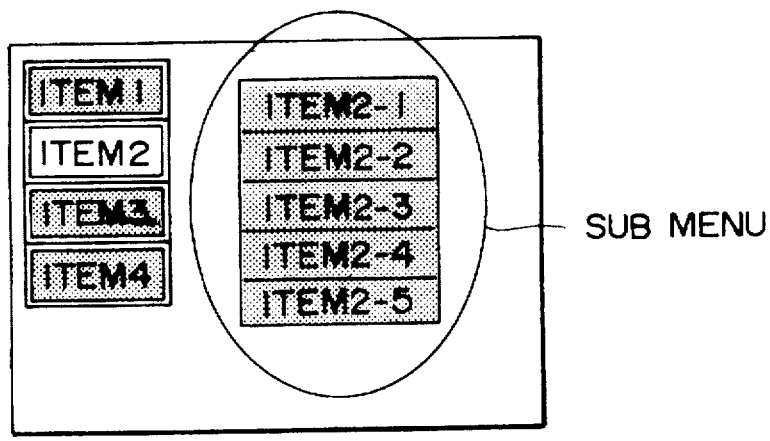
F I G. 4A
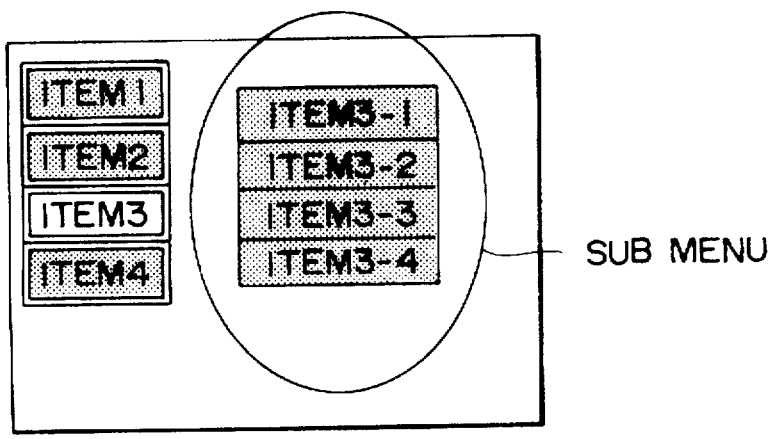
F I G. 4B

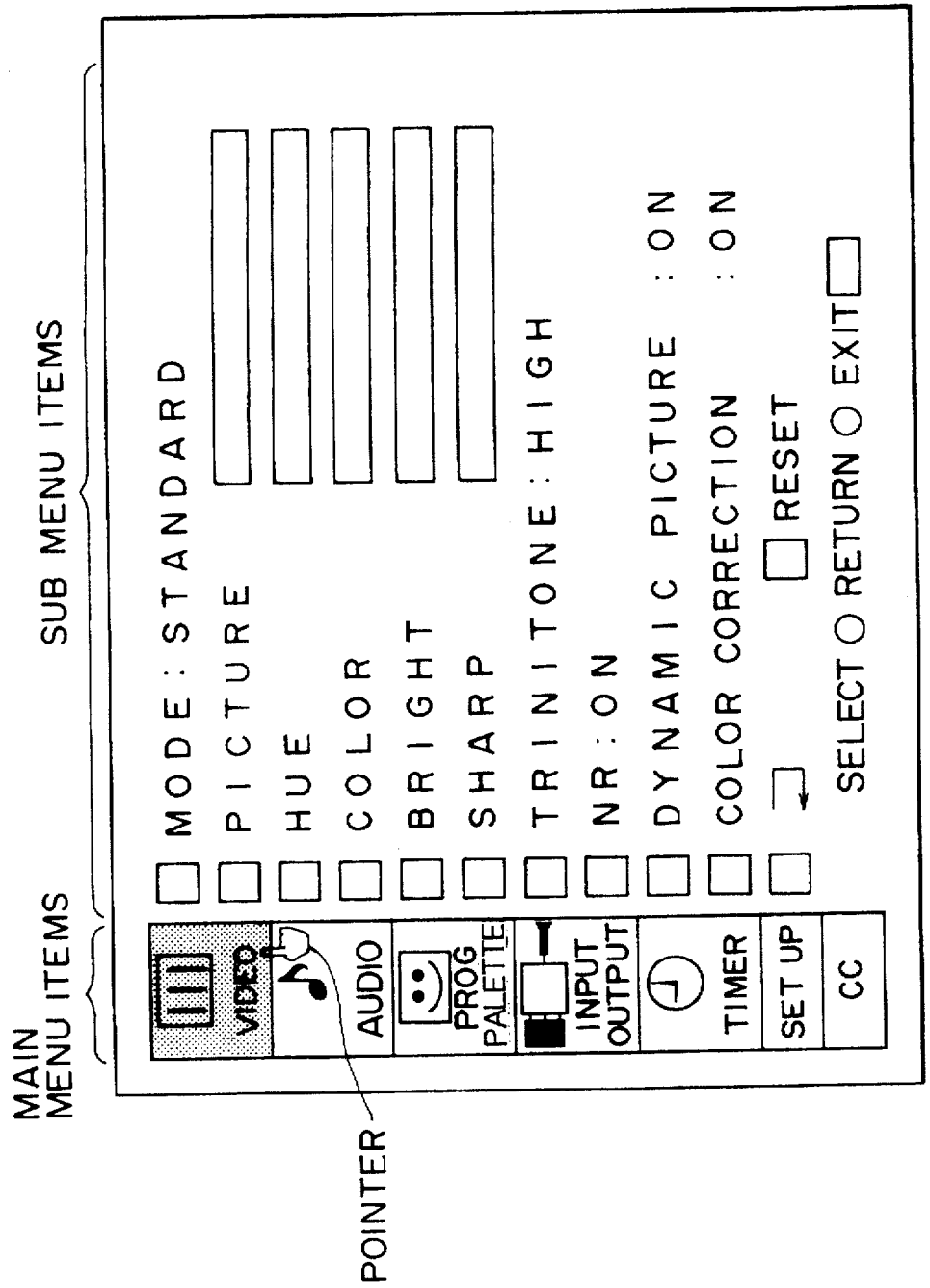

TELEVISION FUNCTION SELECTION METHOD, TELEVISION RECEIVER AND REMOTE COMMANDER FOR TELEVISION RECEIVER

BACKGROUND OF THE INVENTION

This invention relates to a television function selection method, a television receiver and a remote commander for a television receiver, and more particularly to a television function selection method, a television receiver and a remote commander for a television receiver wherein, for example, a hierarchical menu is displayed on a screen of the television receiver and a predetermined function is selected from a displayed menu.

Conventionally, in order to select a function of a television receiver, a user first manually operates an operation panel of a television receiver or a remote commander for the television receiver to display a menu corresponding to the highest level of hierarchy on the screen of the television receiver. The menu is formed of a plurality of selection items or alternatives corresponding to functions of the television receiver.

Then, the user manually operates the operation panel or the remote commander to select one of the selection items. When the selected selection item has selection items of a lower hierarchy relating thereto, the menu of the highest hierarchy level is erased, and the menu of the lower hierarchy is displayed on the screen instead. Then, the user selects one of selection items forming the menu of the lower hierarchy which corresponds to a predetermined function. Consequently, a desired function can be selected. Thereafter, the television receiver performs a predetermined operation based on the selected function.

However, in the case where a function of a television receiver is selected in such a manner as described above, when a menu of a lower hierarchy is displayed, since a menu of a hierarchy at the higher position in the hierarchical structure than the lower hierarchy is erased, it is difficult to understand the relationship between the upper hierarchy and the lower hierarchy. Accordingly, it sometimes occurs that, before a selection item desired to be selected finally is displayed and selected, changing over between hierarchies must be repeated several times. Therefore, the conventional selection of a function of a television receiver is disadvantageous in that complicated cumbersome operations are required.

Further, when it is attempted to select a predetermined selection item from among selection items forming a menu of an upper hierarchy, since selection items of a menu of a lower hierarchy relating to the predetermined selection item cannot be displayed prior to the selection, it is difficult to recognize the structure of the hierarchical menu. Consequently, the conventional selection of a function of a television receiver is disadvantageous also in that even a user who understands a menu structure to some degree must recall the menu structure to mind every time. Operations are difficult for ordinary users.

SUMMARY OF THE INVENTION

It is an object of the present invention to provide a television function selection method, a television receiver and a remote commander for a television receiver wherein a function of a television receiver can be selected simply and rapidly.

In order to attain the object described above, according to an aspect of the present invention, there is provided a television function selection method, comprising the steps of displaying, in a first region of a screen of a television receiver, selection items of one of hierarchies of a hierarchical menu which includes a plurality of hierarchies each including selection items corresponding to functions of the television receiver, designating one of the selection items of the first hierarchy of the menu displayed on the screen of the television receiver, displaying, while the selection items of the first hierarchy of the menu are displayed in the first region of the screen, a lower menu which is a lower hierarchy to the first hierarchy of the menu displayed and includes relating selection items relating to the designated selection item in a second region of the screen of the television receiver which is outside the first region or outside at least a portion of the first region, selecting the designated selection item of the first hierarchy, and selecting one of the related selection items relating to the selected selection item of the first hierarchy.

In the television function selection method, if one of the selection items of a menu displayed in the first region of the screen is designated, then while the menu remains displayed on the screen of the television receiver, a lower menu which is subordinate to the hierarchy of the menu displayed and includes relating selection items relating to the designated selection item is displayed in the second region of the screen different from the first region. Consequently, menus of a plurality of hierarchies can be displayed simultaneously on the screen of the television receiver. Accordingly, the menu structure can be grasped simply by the user, and a desired function of the television receiver can be selected simply and rapidly without the necessity of performing an unnecessary operation.

The number of the hierarchies of the menu may be equal to or greater than 2.

According to another aspect of the present invention, there is provided a television function selection method, comprising the steps of displaying, in a first region of a screen of a television receiver, selection items of one of hierarchies of a hierarchical menu which includes a plurality of hierarchies each including selection items corresponding to functions of the television receiver, designating one of the selection items of the first hierarchy of the menu displayed on the screen of the television receiver, selecting the designated selection item, displaying, while the selection items of the first hierarchy of the menu or at least the selected selection item is displayed in the first region of the screen, a lower menu which is so subordinate to the first hierarchy of the menu and includes relating selection items relating to the selected selection item in a second region of the screen of the television receiver which is outside the first region or outside at least a portion of the first region, and selecting one of the relating selection items forming the displayed lower menu.

In the television function selection method, if one of the selection items of a menu displayed in the first region of the screen is designated and selected, then while the menu or at least the selected selection item remains displayed in the first region of the screen of the television receiver, a lower menu which is subordinate to the hierarchy of the menu and includes relating selection items relating to the selected selection item is displayed in the second region of the screen different from the first region. Consequently, menus of a plurality of hierarchies can be displayed simultaneously on the screen of the television receiver. Accordingly, the menu structure can be understood simply by the user, and a desired function of the television receiver can be selected simply and rapidly without the necessity of performing a unnecessary operation.

The number of the hierarchies of the menu may be equal to or greater than 2.

According to a further aspect of the present invention, there is provided a television receiver, comprising a menu display means for displaying, in a first region of a screen of the television receiver, selection items of one of hierarchies of a hierarchical menu which includes a plurality of hierarchies each including selection items corresponding to functions of the television receiver, a designation means for designating one of the selection items of the first hierarchy of the menu displayed by the menu display means, a lower menu display means for displaying, while the selection items of the first hierarchy of the menu are displayed in the first region of the screen by the menu display means, a lower menu which is subordinate to the first hierarchy of the menu and includes relating selection items relating to the selection item designated by the designation means in a second region of the screen of the television receiver which is outside the first region or outside at least a portion of the first region, a first selection means for selecting the selection item designated by the designation means, and a second selection means for selecting one of the relating selection items relating to the selection item selected by the first selection means.

In the television receiver, if one of the selection items of a menu displayed in the first region of the screen is designated by the designation means, then while the menu remains displayed in the first region of the screen of the television receiver, a lower menu includes relating selection items relating to the designated selection item is displayed in the second region of the screen different from the first region by the lower menu display means. Consequently, menus of a plurality of hierarchies can be displayed simultaneously on the screen of the television receiver. Accordingly, the menu structure can be understood simply by the user, and a desired function of the television receiver can be selected simply and rapidly without the necessity of performing a unnecessary operation.

The number of the hierarchies of the menu may be equal to or greater than 2.

Preferably, the television receiver further comprises a setting means for setting, when one of the selection items of the one hierarchy of the menu displayed by the menu display means is designated by the designation means, whether or not a lower menu which is subordinate to the first hierarchy of the menu should be displayed on the screen, and when the setting means indicates that the lower menu should not be displayed on the screen, the lower menu display means does not display the lower menu on the screen.

In the television receiver, when one of the selection items of a menu displayed on the screen is designated by the designation means, it is set by the setting means whether or not a lower menu corresponding to the designated selection item should be displayed on the screen. Consequently, by setting so that the lower menu should not be displayed on the screen, a function of the television receiver can be selected without disturbing enjoyment of a program of a television broadcast as far as possible.

According to a still further aspect of the present invention, there is provided a remote commander for a television receiver which causes the television receiver to display on a screen of the television receiver a menu including selection items corresponding to functions of the television receiver and instructs, in response to selection of one of the selection items of the menu displayed on the screen of the television receiver, the television receiver to execute a corresponding one of the functions, the remote commander comprising a menu display instruction means for inputting an instruction for displaying, in a first region of a screen of the television receiver, selection items of one of hierarchies of a hierarchical menu which includes a plurality of hierarchies each including selection items corresponding to functions of the television receiver, a designation means for designating one of the selection items of the first hierarchy of the menu displayed on the screen of the television receiver in response to the instruction of the menu display instruction means, a lower menu display instruction means for inputting, while the selection items of the first hierarchy of the menu are displayed in the first region of the screen in response to the instruction of the menu display instruction means, an instruction whether or not a lower menu which is subordinate to the first hierarchy of the menu and includes relating selection items relating to the selection item designated by the designation means should be displayed in a second region of the screen of the television receiver which is outside the first region or outside at least a portion of the first region, a first selection means for selecting the selection item designated by the designation means, and a second selection means for selecting one of the relating selection items relating to the selection item selected by the first selection means.

In the remote commander for a television receiver, one of the selection items of a menu displayed in the first region of the screen is designated by the designation means, and then, while the menu remains displayed in the first region of the screen of the television receiver, it is designated by the lower menu display designation means whether or not a lower menu which includes relating selection items relating to the selection item designated by the designation means should be displayed in the second region of the screen different from the first region. Consequently, menus of a plurality of hierarchies can be displayed simultaneously on the screen of the television receiver. Accordingly, the menu structure can be understood simply by the user, and a desired function of the television receiver can be selected simply and rapidly without the necessity of performing an unnecessary operation.

The number of the hierarchies of the menu may be equal to or greater than 2.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 2 shows a block diagram of FIGS. 2A-2C.

FIGS. 2A-2C are flow charts illustrating operation of the television receiver of FIG. 1;

FIG. 3 is a schematic view showing an example of a menu screen when an item "ITEM 1" of a main menu is designated;

FIGS. 4A and 4B are schematic views showing an example of menu screens when items "ITEM 1" and "ITEM 2" of the main menu are designated, respectively;

FIG. 7 is a schematic view showing an example of a menu screen when an item "VIDEO" of the main menu is designated;

DESCRIPTION OF THE PREFERRED EMBODIMENTS

Figure 1:
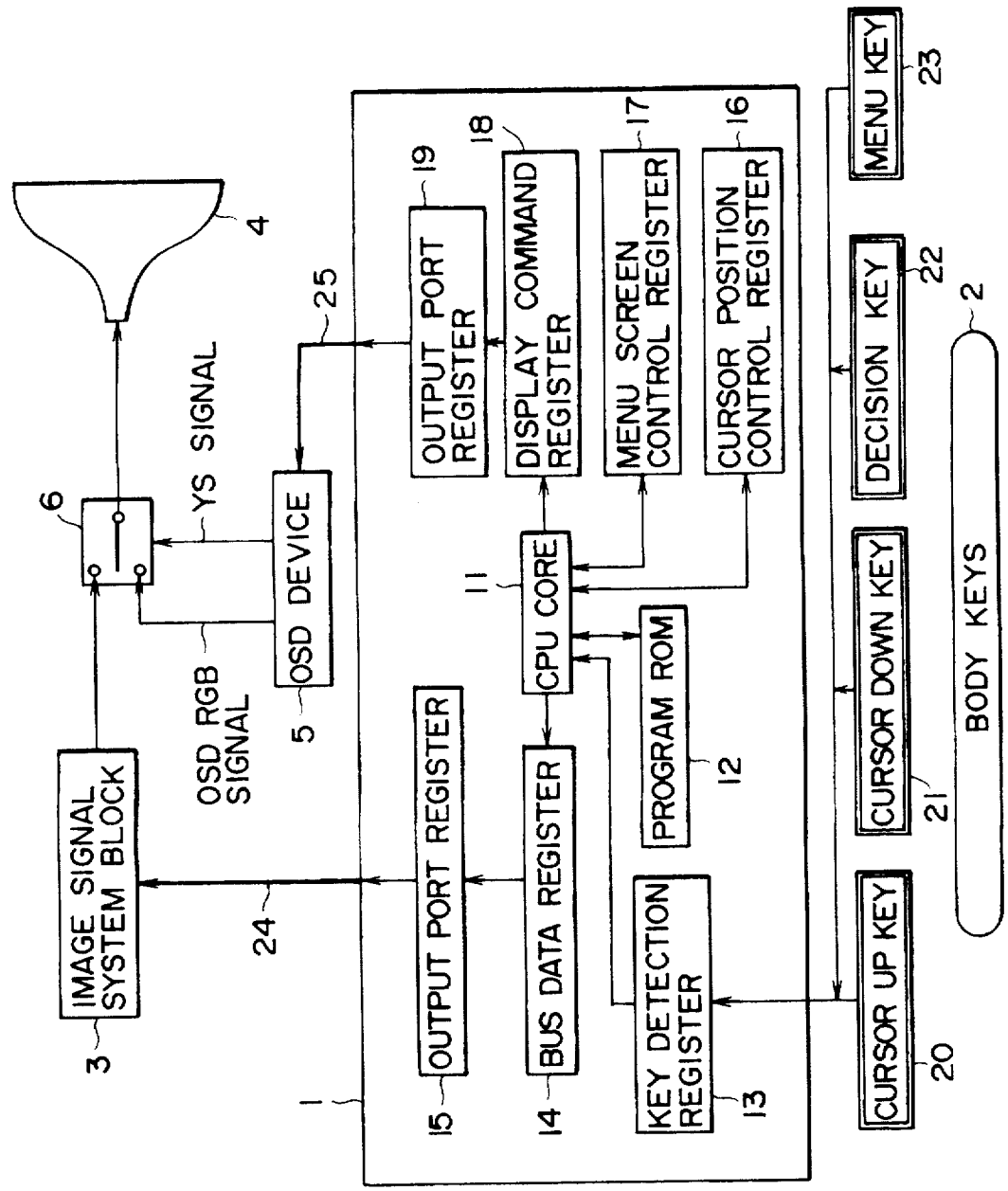
FIG. 1 is a block diagram showing a construction of a television receiver to which the present invention is applied.

Referring first to FIG. 1, there is shown in block diagram a construction of a television receiver to which the present invention is applied. The television receiver includes a body key apparatus 2 (setting means) which in turn includes a cursor up (Cursor UP) key 20 (designation means), a cursor down (Cursor DOWN) key 21 (designation means), a decision key 22 (first selection means, second selection means) and a menu (Menu) key 23. If one of the keys of the body key apparatus 2 is selectively depressed, then a signal corresponding to a key code of the depressed key is supplied to a system control microcomputer (system controlling microcomputer) 1.

The system control microcomputer 1 includes a program ROM (Read Only Memory) 12 in which a predetermined program and various data are stored, a CPU (Central Processor Unit) core 11 for controlling components of the system control microcomputer 1 in accordance with the program stored in the program ROM 12, a key detection register 13 for receiving and holding a signal corresponding to a key code supplied from the body key apparatus 2, a bus data register 14 for storing and outputting predetermined data supplied from the CPU core 11, an output port register 15 for receiving output data from the bus data register 14 and outputting the received data to an bus line 24, a cursor position control register 16 for holding data for control ling the position of a cursor, a menu screen controlling register 17 for holding data for controlling a menu screen, a display command register 18 for holding a display command for displaying a menu, and an output port register 19 for receiving an output signal corresponding to a predetermined command from the display command register 18 and outputting the received signal to another bus line 25. The system control microcomputer 1 controls a video signal system block 3 and an On Screen Display (OSD) device 5 (menu display means, lower menu display means) which will be described below.

The video signal system block 3 is controlled by a control signal supplied thereto from the output port register 15 of the system control microcomputer 1 via the bus line 24 and outputs a predetermined video signal.

The OSD device 5 generates, in accordance with a control signal supplied thereto from the system control microcomputer 1 via the bus line 25, an RGB signal of OSD data corresponding to a character, a graphic form, a cursor or the like for displaying a predetermined menu screen and a control signal (YS signal) for controlling a switch 6. The generated signals are supplied to the switch 6.

The switch 6 is controlled by the CPU core 11 and changes over the internal connection thereof so that it selectively receives one of a video signal supplied from the video signal system block 3 or an RGB signal supplied from the OSD device 5 corresponding to OSD data and supplies the selected signal to a CRT 4.

The CRT 4 displays, on the screen thereof, an image corresponding to a video signal supplied thereto from the switch 6 or a character, a graphic form or the like corresponding to an RGB signal of OSD data.

Figure 2A:
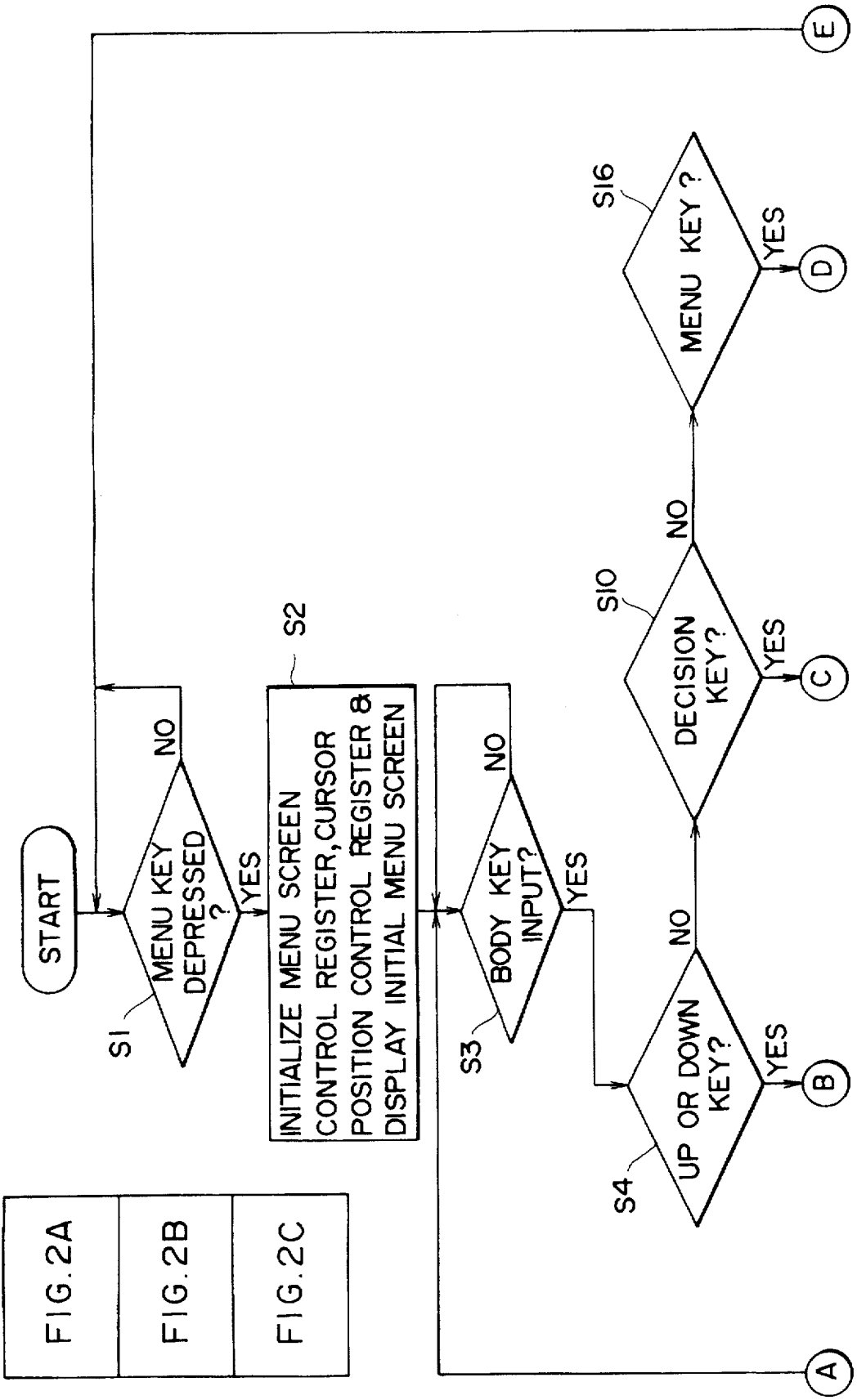

Operation of the television receiver described above will be described subsequently with reference to the flow charts of FIGS. 2A–2C. First at step S1, it is discriminated whether or not the menu key 23 of the body key apparatus 2 provided on the body of the television receiver is depressed by a user. In the discrimination, the CPU core 11 reads out data stored in the key detection register 13 and discriminates whether or not the data is key code data corresponding to the menu key 23.

When the CPU core 11 discriminates that the menu key 23 is not depressed, the processing at step S1 is executed repetitively. On the other hand, when it is discriminated that the menu key 23 is depressed, the control sequence advances to step S2.

At step S2, initial values are placed into the menu screen controlling register 17 and the cursor position control register 16. In particular, information representing that, for example, the highest hierarchy level of a hierarchical menu is an object of control at present is placed into the menu screen controlling register 17, and information representing that, the cursor is positioned at the first item of the menu of the highest hierarchy level is placed into the cursor position control register 16.

Then, in accordance with the information, the CPU core 11 places a predetermined display command for displaying a corresponding menu screen into the display command register 18. The display command is supplied to the OSD device 5 via the output port register 19 and the bus line 25.

The OSD device 5 generates an RGB signal of predetermined OSD data corresponding to the display command supplied thereto and supplies the RGB signal to the switch 6. The OSD device 5 further generates a control signal for changing over the internal connection of the switch 6 so that an output signal of the OSD device 5 may be supplied to the CRT 4 or so that a video signal outputted from the video signal system block 3 may be supplied to the CRT 4. The control signal thus generated is supplied to the switch 6.

In particular, where a menu is to be displayed, the internal connection of the switch 6 is changed over so that an output signal of the OSD device 5 may be supplied to the CRT 4, but where a program of an ordinary television broadcast is to be displayed, the internal construction of the switch 6 is changed over so that a video signal outputted from the video signal system block 3 may be supplied to the CRT 4.

As a result, a menu is displayed on the screen of the CRT 4 in a superposed relationship with a program of an ordinary television broadcast as shown in FIG. 3. In this instance, the main menu of the highest hierarchy level is displayed on a left side portion of the screen while a sub menu of a lower hierarchy level is displayed on a right side portion of the screen. In this instance, the main menu is formed of, for example, items "ITEM 1" to "ITEM 4" each formed with an icon, and, the first item "ITEM 1" of the main menu is displayed in such an emphasized condition that it is displayed in a reversed condition or in a highlighted condition. Then, a sub menu of the highlighted "ITEM 1" displayed is displayed on the right side portion of the screen. In this instance, "ITEM 1-1" to "ITEM 1-3" are displayed as the items of the sub menu.

Thereafter, the control sequence advances to step S3, at which it is discriminated whether or not one of the keys of the body key apparatus 2 is depressed. In this instance, the discrimination of depression of a key of the body key apparatus 2 depends upon whether or not key data corresponding to one of the keys of the body key apparatus 2 is stored in the key detection register 13. When it is discriminated that none of the keys of the body key apparatus 2 is depressed, the processing at step S3 is executed repetitively. On the other hand, if it is discriminated that one of the keys of the body key apparatus 2 is depressed, the control sequence advances to step S4.

At step S4, the key data detected by the key detection register 13 is decoded, and it is discriminated whether or not the depressed key of the body key apparatus 2 is one of the cursor up key 20 or the cursor down key 21. If it is discriminated that the depressed key of the body key apparatus 2 is one of the cursor up key 20 or the cursor down key 21, the control sequence advances to step S5. At step S5, a new position of the cursor is determined from the cursor position at present, in this instance, the position of the highlighted displayed item, the kind of the depressed with key. The value of the cursor position control register 16 is re-written with the new cursor position.

Then, the control sequence advances to step S6, at which a display command for displaying the main menu in which an item corresponding to the new cursor position is displayed highlighted on the screen in order to reflect on the screen that the cursor has moved recently is placed into the display command register 18.

Then at step S7, it is discriminated whether or not the television receiver is set by a user so that a sub menu of the lower hierarchy corresponding to the item on the main menu at which the cursor is positioned is to be displayed. Up on the setting whether or not the sub menu should be displayed, as hereinafter described in connection with step S18, a flag for setting the display of a sub menu to be displayed as an item of the main menu on the screen to on (to be displayed) or off (not to be displayed) is selected.

When it is discriminated at step S7 that the television receiver is not set so that a sub menu of the lower hierarchy corresponding to the item at which the cursor is positioned at present is displayed, the control sequence advances to step S15. At step S15, the display command placed in the display command register 18 is outputted to the bus line 25 via the output port register 19 and supplied to the OSD device 5. The OSD device 5 generates an RGB signal of OSD data and a control signal corresponding to the received display command and supplies the signals to the switch 6. The switch 6 changes over the internal connection thereof in response to the control signal supplied thereto and supplies the RGB signal of the OSD data at a predetermined timing to the CRT 4. In this instance, since it is not set by the user so as to display a sub menu, a display command for displaying a sub menu is not placed in the display command register 18, and consequently, the sub menu is not displayed while only the main menu is displayed.

On the other hand, where the television receiver is set so as to display a sub menu of the lower hierarchy, the control sequence advances to step S8, at which information corresponding to the cursor position is read out from the cursor position control register 16. Then, the control sequence advances to step S9, at which, when there is a sub menu of the lower hierarchy relating to the selection item on the main menu at which the cursor is positioned, a display command for displaying the sub menu is placed into the display command register 18, whereafter the control sequence advances to step S15.

If, for example, the cursor down key 21 is depressed by a user, then a display command for displaying a screen on which the cursor is moved to the item "ITEM 2" of the main menu is placed into the display command register 18 and supplied from the output port register 19 to the OSD device 5 via the bus line 25 under the control of the CPU core 11. The OSD device 5 generates an RGB signal of OSD data and a control signal corresponding to the menu screen on which the cursor is moved to the "ITEM 2" and supplies the signal to the switch 6.

The RGB signal supplied to the switch 6 is supplied at a predetermined timing to the CRT 4 as a result of a changing over operation of the switch 6 in accordance with the control signal. Consequently, such a menu screen as shown in FIG. 4A is displayed. In this manner, the "ITEM 2" is displayed highlighted and a sub menu corresponding to the "ITEM 2" is displayed. In this instance, the sub menu of the "ITEM 2" includes items "ITEM 2-1" to "ITEM 2-5".

Further, if the cursor down key 21 is depressed by the user, then such a menu screen as shown in FIG. 4B is displayed in a similar manner as described above. In this instance, the "ITEM 3" is displayed highlighted, and a sub menu of the "ITEM 3" is displayed. Here, the sub menu of the "ITEM 3" includes items "ITEM 3-1" to "ITEM 3-4".

On the other hand, if the selection item on the main menu at which the cursor is positioned has no sub menu of lower hierarchy relating thereto at step S9, then no processing is executed, and the control sequence advances directly to step S15. At step S15, the CPU core 11 produces a display command for displaying the cursor at the cursor position read out from the cursor position control register 16 and supplies the display command to the display command register 18. The display command is thereafter supplied to the OSD device 5 via the output port register 19 and the bus line 25.

The OSD device 5 generates an RGB signal of predetermined OSD data and a control signal in response to the display command supplied thereto and supplies the signals to the switch 6. The RGB signal supplied to the switch 6 is supplied at a predetermined timing to the CRT 4, on which a corresponding menu screen is displayed. In this instance, the predetermined item of the main menu is displayed highlighted, and no corresponding sub menu to the item is displayed since such sub menu does not exist.

If it is discriminated at step S4 that the depressed key of the body key apparatus 2 is neither the cursor up key 20 nor the cursor down key 21, the control sequence advances to step S10, at which it is discriminated whether or not the depressed key of the body key apparatus 2 is the decision key 22. When it is discriminated that the depressed key of the body key apparatus 2 is not the decision key 22, then the control sequence advances to step S16. On the other hand, if the depressed key of the body key apparatus 2 is the decision key 22, the control sequence advances to step S11.

At step S11, for example, information regarding the hierarchy of the menu which is an object of processing at present is read out from the menu screen controlling register 17 while cursor position information regarding the position of the cursor at present is read out from the cursor position control register 16 by the CPU core 11. Then, the control sequence advances to step S12, at which the item on the main menu whose selection has been indicated by the depression of the decision key 22 is recognized based on the information thus read out and it is discriminated whether or not a sub menu of lower hierarchy relating to the recognized item is present.

If it is discriminated that the predetermined item on the main menu whose selection has been indicated does not have a sub menu positioned in a lower hierarchy to it, the control sequence advances to step S18. On the other hand, if it is discriminated that a sub menu of lower hierarchy is present, then the control sequence advances to step S13. At step S13, a pointer in the program which represents the position at which the cursor is present is set to the first item of the sub menu present in the lower hierarchy to the main menu by the CPU core 11. Consequently, processing such as movement of the cursor or selection of an item is thereafter performed on that sub menu of the hierarchy.

Then, cursor position information corresponding to the position of the first item of the sub menu is written into the cursor position control register 16 so that the cursor may be displayed on the first item of the sub menu.

Thereafter, the control sequence advances to step S14, at which a display command for displaying a new menu screen is produced by the CPU core 11 and placed into the display command register 18. The display command placed in the display command register 18 is supplied, at step S15, to the OSD device 5 via the output port register 19 and the bus line 25. The OSD device 5 generates an RGB signal corresponding to the new menu screen and a control signal in accordance with the display command supplied thereto and supplies the signals to the switch 6. The switch 6 supplies an RGB signal from the OSD device 5 and a video signal from the video signal system block 3 and sends them at a predetermined timing to the CRT 4 in response to the control signal from the OSD device 5.

Figure 5:
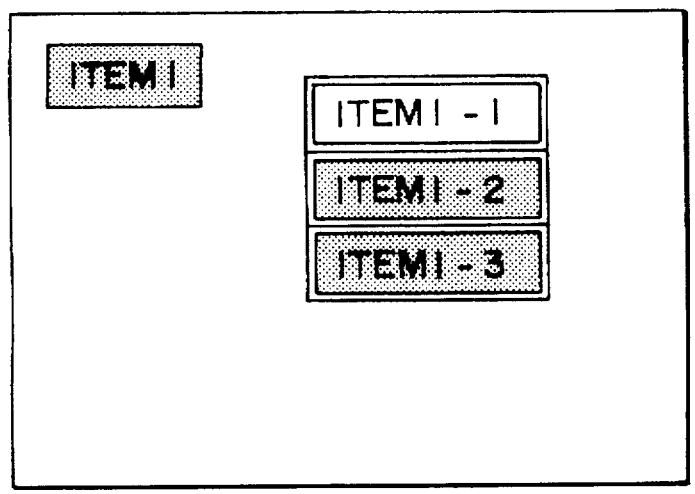
FIG. 5 is a schematic view showing an example of a menu screen when an item "ITEM 1-1" of a sub menu is designated.

As a result, a new menu screen as shown in FIG. 5 is displayed on the CRT 4. On the menu screen, the item "ITEM 1" of the main menu and a sub menu of the "ITEM 1" of the main menu are displayed, and "ITEM 1-1" which is the first item of the sub menu is displayed highlighted. In other words, the cursor is positioned at the "ITEM 1-1". Then, as described hereinabove, a manual operation of the cursor up key 20, the cursor down key 21, the decision key 22 or the menu key 23 is performed for the sub menu.

Thereafter, the control sequence advances to step S3 so that the processing at the steps beginning with step S3 is repeated.

On the other hand, if it is discriminated at step S12 that the predetermined item of the main menu whose selection has been settled by the decision key 22 does not have a sub menu positioned subordinate thereto, that is, if it is discriminated that the predetermined item is not an item at which movement of the cursor to a next selection item should be performed but is an item at which predetermined processing which is an object with for which predetermined control is to be performed, the control sequence advances to step S18.

At step S18, it is discriminated whether or not the item whose selection has been indicated is an item for setting the display of a sub menu to on or off. If it is discriminated that the item whose selection has been settled is an item for setting the display of a sub menu to on or off, the control sequence advances to step S19. At step S19, when the display of a sub menu is currently set in an on state, the display of the sub menu is set to off, but when the display of a sub menu is currently set in an off state, the display of the sub menu is set to on.

Figure 6A:
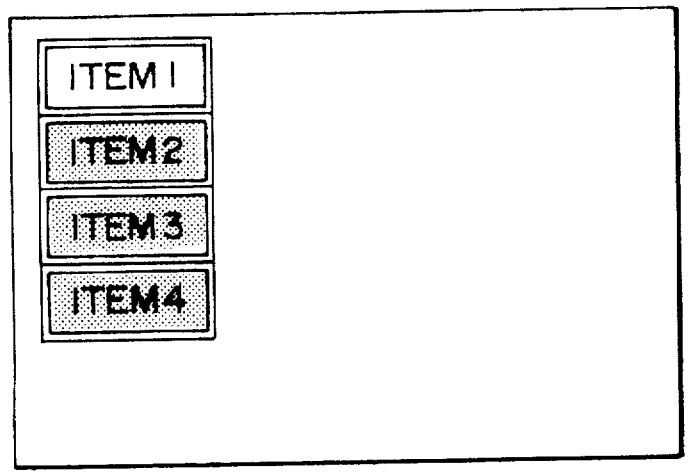
FIGS. 6A, 6B and 6C are schematic views showing examples of a menu screen when the display of the sub menu is erased.
Figure 6B:
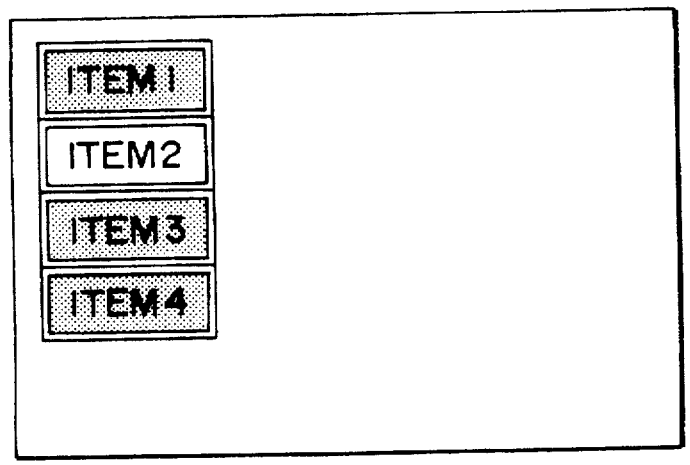
Figure 6C:
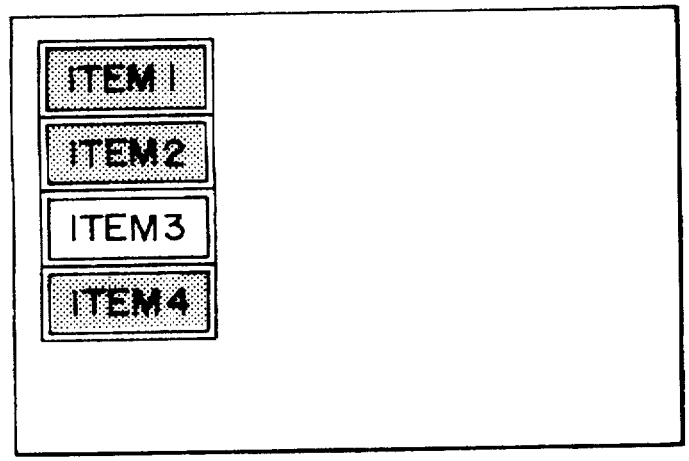

As a result, when a sub menu is displayed on the screen of the CRT 4, the sub menu is erased, but when no sub menu is displayed on the screen of the CRT 4, the sub menu is displayed newly. FIGS. 6A to 6C shows examples of a screen when the display of a sub menu is set to off. IN particular, FIG. 6A shows an example of a screen when the cursor is positioned at the "ITEM 1" which is the first item of the main menu and the item is displayed highlighted. Similarly, FIG. 6B shows an example of a screen when the cursor is positioned at the "ITEM 2" and the item is displayed highlighted. FIG. 6C shows an example of a screen when the cursor is positioned at the "ITEM 3" and the item is displayed highlighted.

On the other hand, if it is discriminated at step S18 that the item whose selection has been indicated is not an item for setting the display of a sub menu to on or off, the control sequence advances to step S20, at which other processing is executed under the control of the CPU core 11. In particular, predetermined processing corresponding to the item whose selection has been indicated is executed. If it is recognized by the CPU core 11 that the processing is for setting a video mode of the television receiver as hereinafter described, then a corresponding instruction is supplied from the CPU core 11 to the bus data register 14. The instruction is supplied to the video signal system block 3 via the output port register 15 and the bus line 24. The video signal system block 3 generates and outputs a video signal corresponding to the indicate video mode in accordance with the instruction.

On the other hand, if it is discriminated at step S10 that the decision key 22 is not depressed, the control sequence advances to step S16, at which it is discriminated whether or not the menu key 23 is depressed. In the present embodiment, when the depressed key is not any one of the cursor up key 20, the cursor down key 21 or the decision key 22, it is the menu key 23, and consequently, it is discriminated that the menu key 23 is depressed and the control sequence advances to step S17. At step S17, the menu display is turned off.

To this end, the CPU core 11 produces a command for stopping the display of a menu screen and supplies the command to the display command register 18. The command supplied to the display command register 18 is supplied to the OSD device 5 via the output port register 19 and the bus line 25. The OSD device 5 generates, in response to the command supplied thereto, a control signal for instructing the switch 6 to change over its internal connection of it so that, for example, a video signal from the video signal system block 3 may be supplied to the CRT 4, and supplies the control signal to the switch 6. As a result, only a video signal from the video signal system block 3 is supplied to the CRT 4, and no menu is displayed.

In this manner, by depressing the menu key 23, a menu of whichever hierarchy is currently displayed, the display of the menu can be ended. When it is desired to display the menu again, the menu key 23 should be depressed again. Accordingly, by depressing the menu key 23, the menu display can be alternately changed over between on and off.

Thereafter, the control sequence returns to step S1 so that the processing beginning with step S1 is repeated.

FIGS. 7 to 15 show different examples of a menu screen which can be used with the television receiver. The main menu is formed of items (icons) displayed on a left side portion of the screen, and here, the following items are displayed. In particular, they are items "VIDEO", "AUDIO", "PROG PALETTE", "INPUT OUTPUT", "TIMER", "SET UP" and "CC".

FIG. 7 shows a condition wherein the pointer (cursor) is positioned on the item "VIDEO" of the main menu and the item is displayed highlighted while a sub menu subordinate to the item is displayed. It can be understood from items of the displayed sub menu that various settings relating to an image can be performed by selective setting of the item "VIDEO" of the main menu.

Where, shown for example in FIG. 17 a remote commander 100 which will be hereinafter described is used, a select button 132 is first manually operated in an upward or downward direction to position the pointer to the item "VIDEO", and then the select button 132 is depressed in a vertical direction so that the selection of the item "VIDEO" can be indicated. This makes it possible to select a desired one of the items of the sub menu corresponding to the item "VIDEO" of the main menu. Consequently, by manually operating the select button 132 in an upward or downward direction, the pointer can be moved to a desired item of the sub menu, and then by depressing the select button 132 in a vertical direction, the item can be selected.

Figure 8:
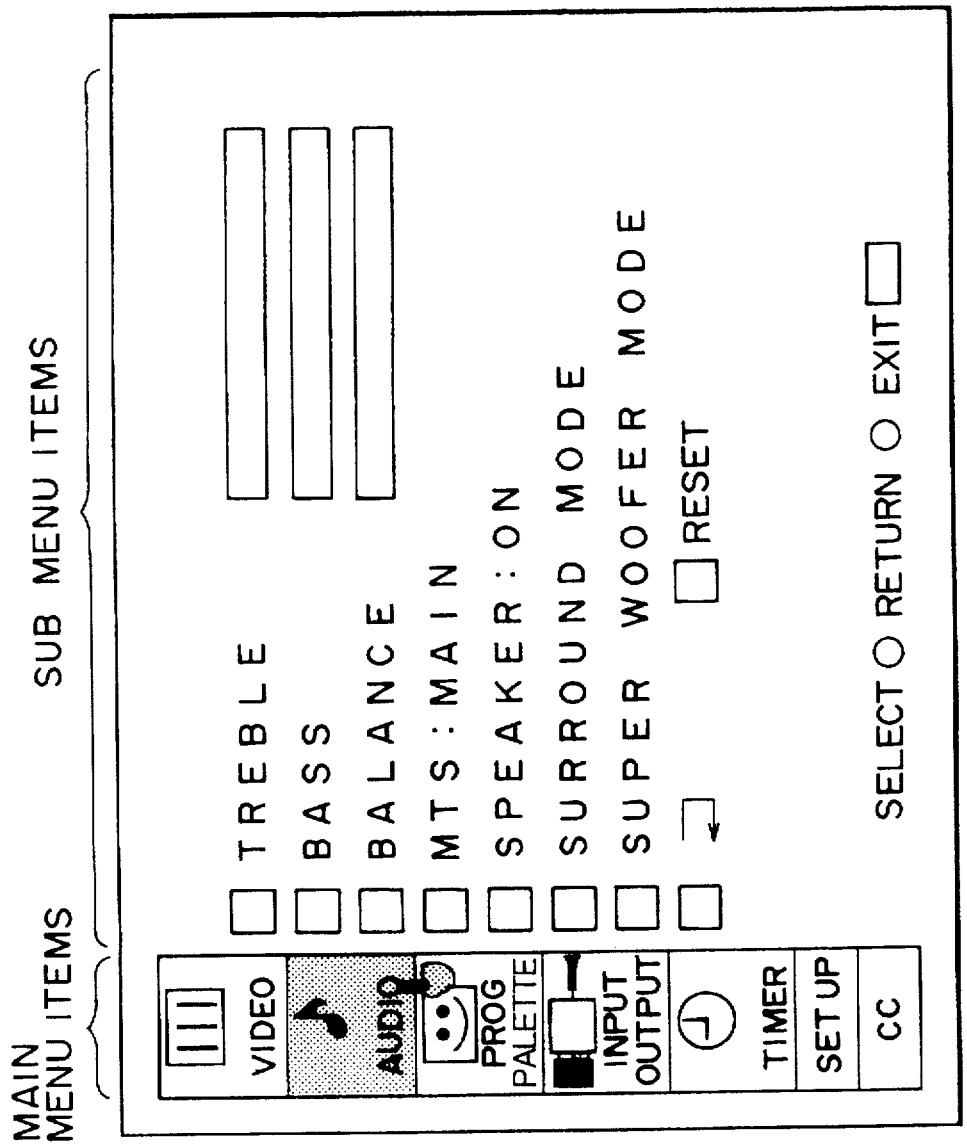
FIG. 8 is a schematic view showing an example of a menu screen when an item "AUDIO" of the main menu is designated.

FIG. 8 illustrates a condition wherein the pointer is positioned on the item "AUDIO" of the main menu and the item is displayed highlighted while a sub menu positioned subordinate to the item is displayed. From the items of the displayed sub menu, it can be understood that various settings relating to sound can be performed by selective settlement of the item "AUDIO" of the main menu.

Figure 9:
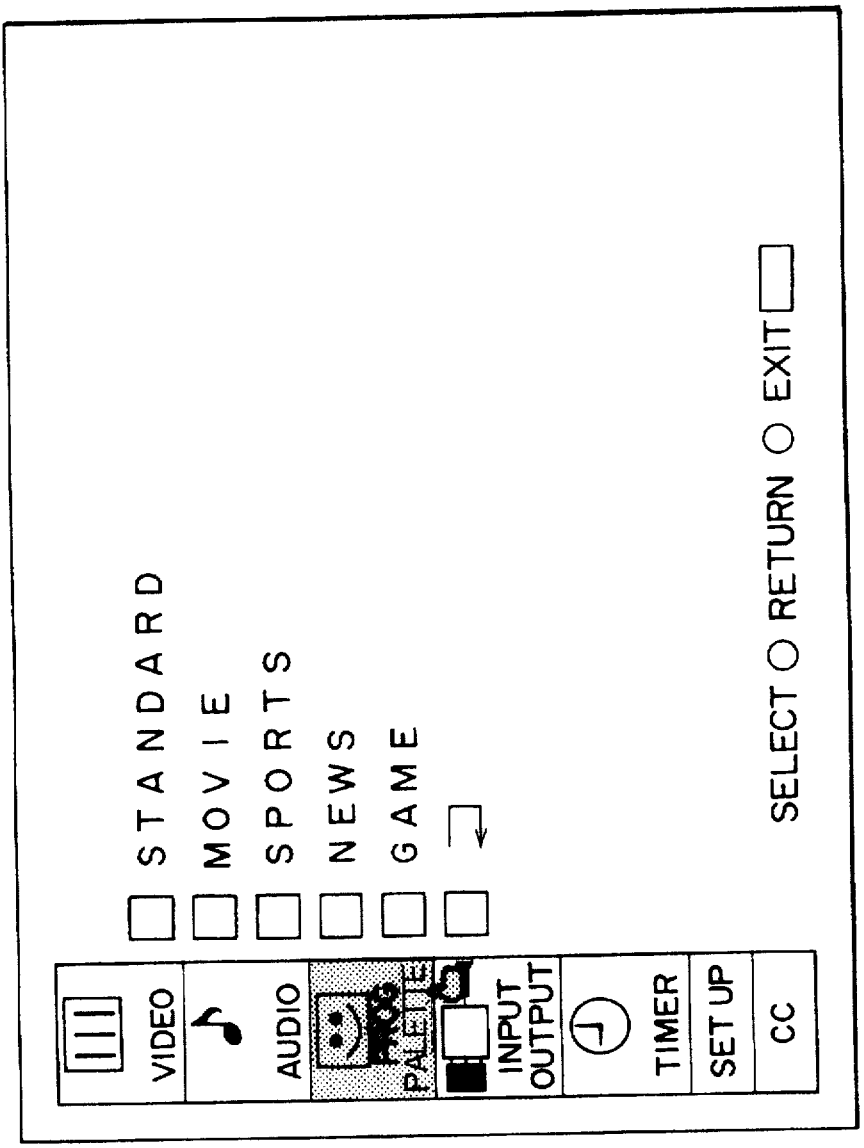
FIG. 9 is a schematic view showing an example of a menu screen when an item "PROG PALETTE" of the main menu is designated.

FIG. 9 illustrates a condition wherein the pointer is positioned on the item "PROG PALETTE" of the main menu and the item is displayed highlighted while a sub menu positioned subordinate to the item is displayed. From the items of the displayed sub menu, it can be understood that various settings relating to an image suitable to a kind of a program can be performed by selective settlement of the item "PROG PALETTE" of the main menu. Here, adjustment values of the "PICTURE" and the "COLOR CORRECTION" which can be set in FIG. 7 are set by the user in advance and are prepared as five different program palettes. Then, the user can select one of the palettes.

For example, if the item "MOVIE" of the sub menu is selected, then various adjustment values which can be set are adjusted to values suitable for enjoyment of a program of a movie by settling the selection of the item "VIDEO" of the main menu as described hereinabove. Also with regard to each of the other items "STANDARD", "SPORTS", "NEWS" and "GAME", by selecting the item, the various adjustment values described above are adjusted to values suitable for enjoyment of an ordinary program, a sport program, a news program or a screen of a game.

Figure 10:
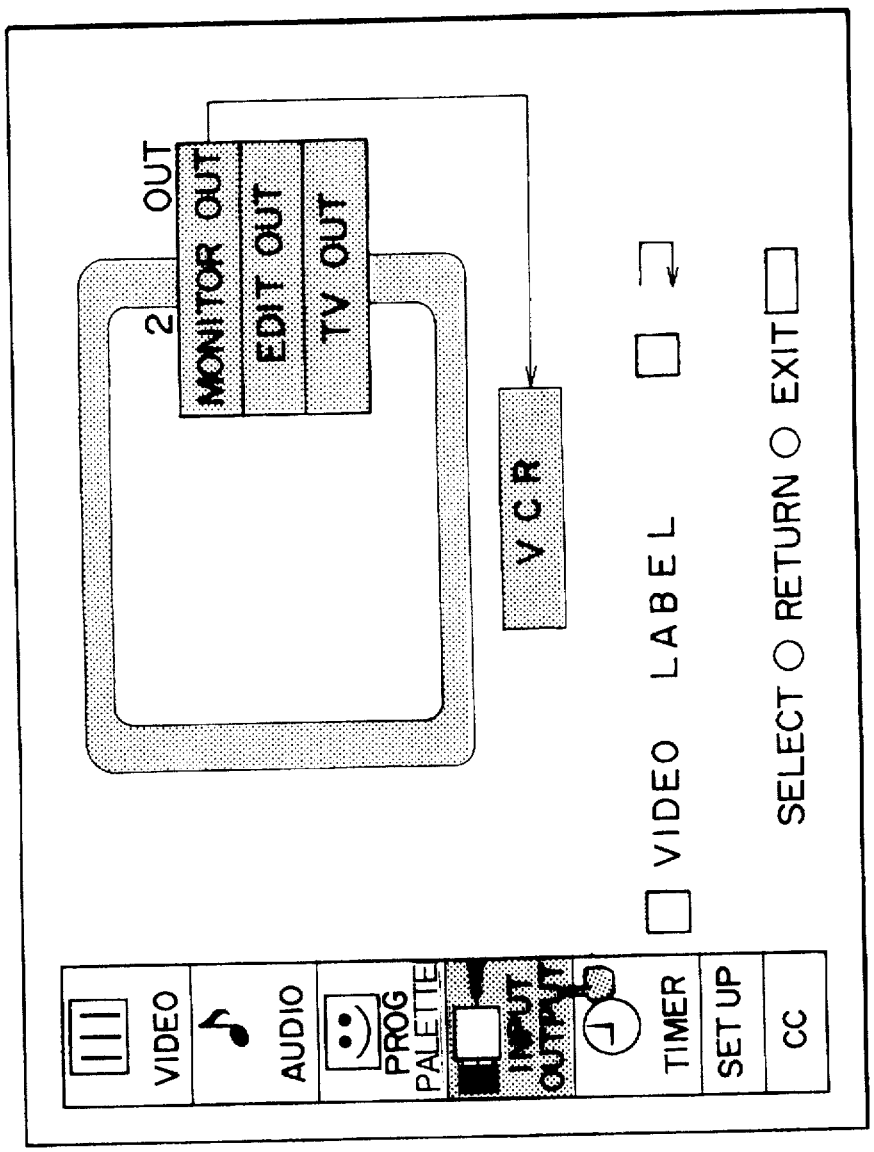
FIG. 10 is a schematic view showing an example of a menu screen when an item "INPUT OUTPUT" of the main menu is designated.

FIG. 10 illustrates a condition wherein the pointer is positioned on the item "INPUT OUTPUT" of the main menu and the item is displayed highlighted while a sub menu positioned subordinate to the item is displayed. From the items of the displayed sub menu, it can be understood that various settings relating to an input and an output of the television receiver can be performed by selection of the item "INPUT OUTPUT" of the main menu. In the present embodiment, it is shown that a signal is output from a monitor output terminal (MONITOR OUT) of the television receiver and supplied to a video cassette recorder (VCR).

Figure 11:
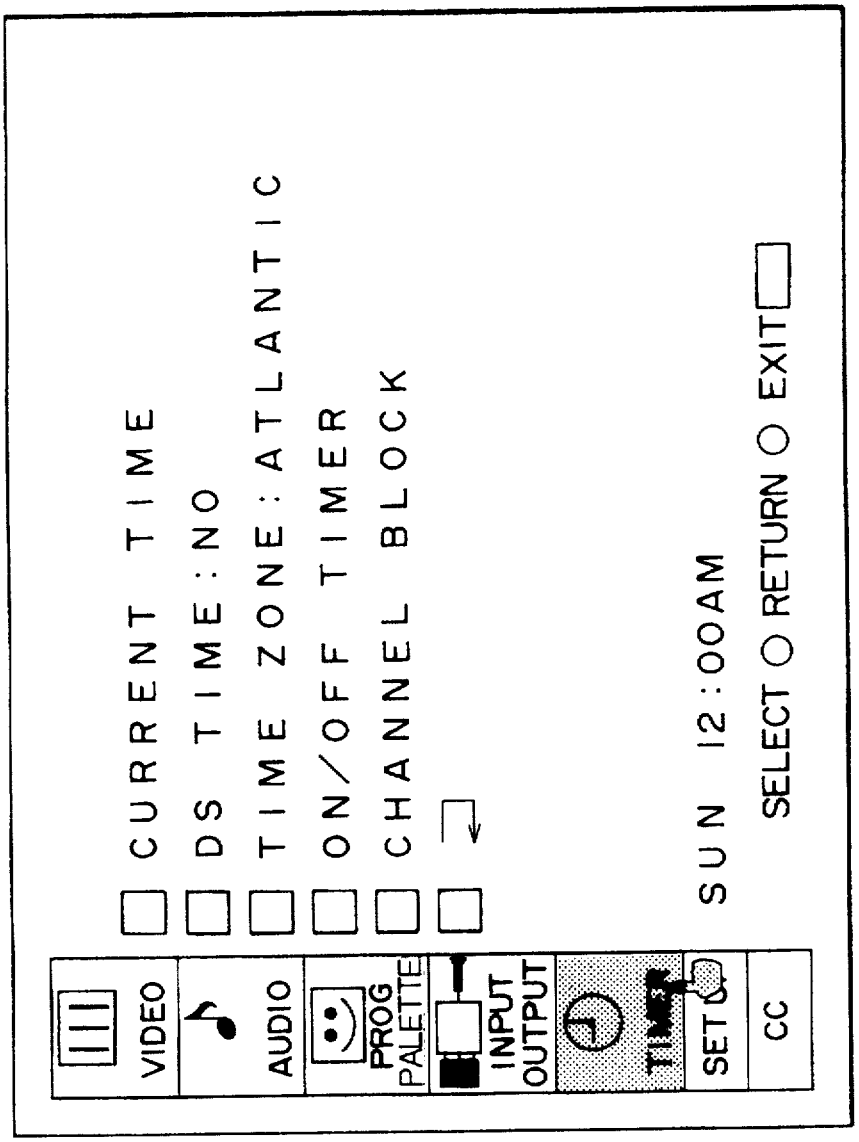
FIG. 11 is a schematic view showing an example of a menu screen when an item "TIMER" of the main menu is designated.

FIG. 11 illustrates a condition wherein the pointer is positioned on the item "TIMER" of the main menu and the item is displayed highlighted while a sub menu positioned subordinate to the item is displayed. From the items of the displayed sub menu, it can be understood that various settings relating to the time can be performed by selection of the item "TIMER" of the main menu.

Figure 12:
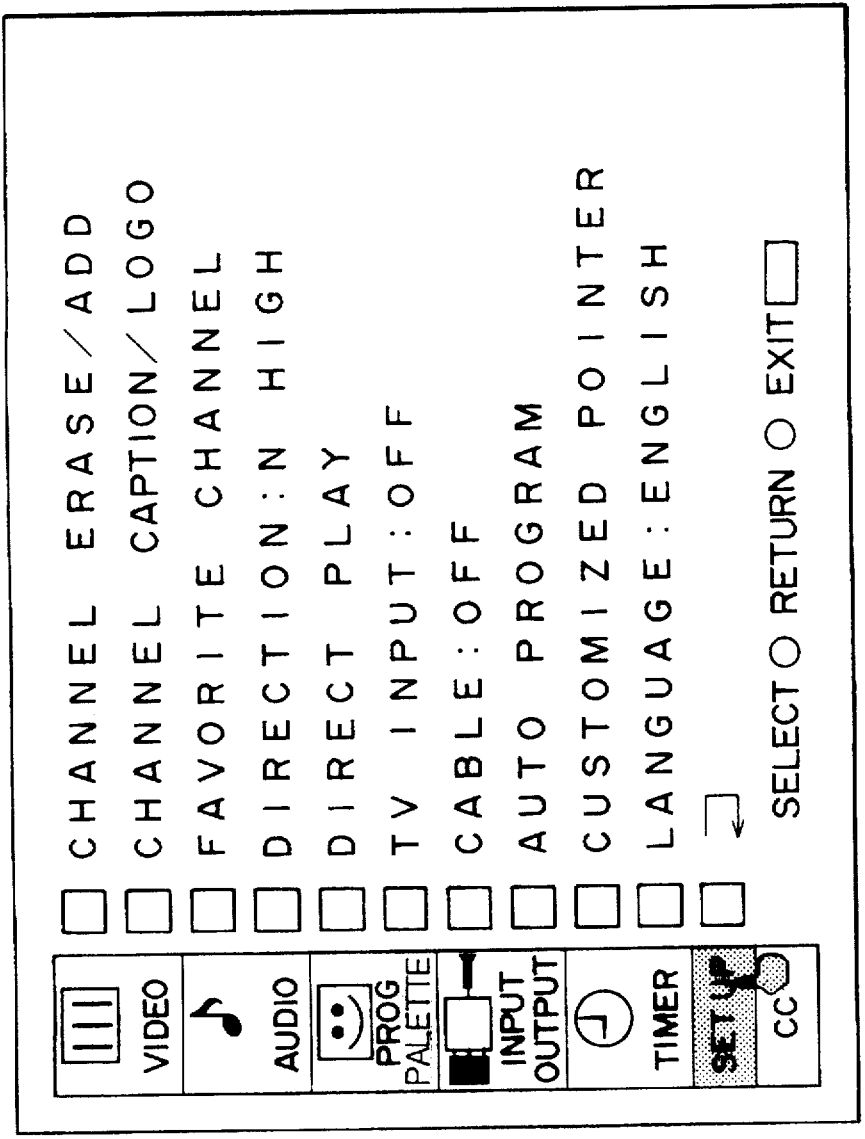
FIG. 12 is a schematic view showing an example of a menu screen when an item "SETUP" of the main menu is designated.

FIG. 12 illustrates a condition wherein the pointer is positioned on the item "SETUP" of the main menu and the item is displayed highlighted while a sub menu positioned subordinate to the item is displayed. From the items of the displayed sub menu, it can be understood that various initial settings can be performed by selection of the item "SETUP" of the main menu.

Figure 13:
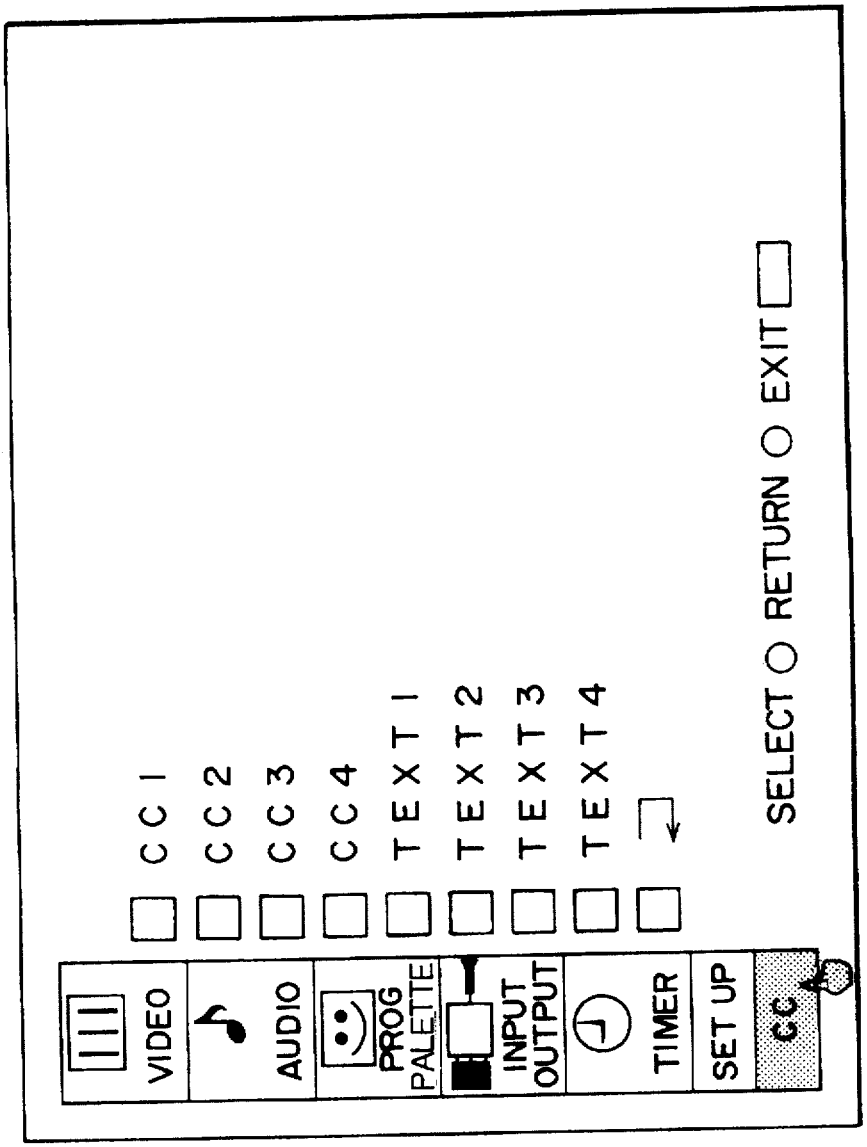
FIG. 13 is a schematic view showing an example of a menu screen when an item "CC" of the main menu is designated.

FIG. 13 illustrates a condition wherein the pointer is positioned on the item "CC" of the main menu and the item is displayed highlighted while a sub menu positioned subordinate to the item is displayed. From the items of the displayed sub menu, it can be understood that various settings relating to a closed caption or a teletext can be performed by selection of the item "CC" of the main menu. For example, items "CC1" to "CC4" correspond to languages such as English and Spanish, and items "TEXT1" to "TEXT4" correspond to programs of a teletext.

Since the pointer moves on the main menu in response to a manual operation by a user and a sub menu which corresponds to a predetermined item on the main menu at which the pointer is positioned is displayed on a screen in this manner, it can be recognized immediately what setting can be performed by selection the item of the main menu. Accordingly, even if the user is unfamiliar with the operation of the television receiver, the relationship between the main menu and the sub menu can be understood simply, and desired setting can be performed rapidly.

Figure 14:
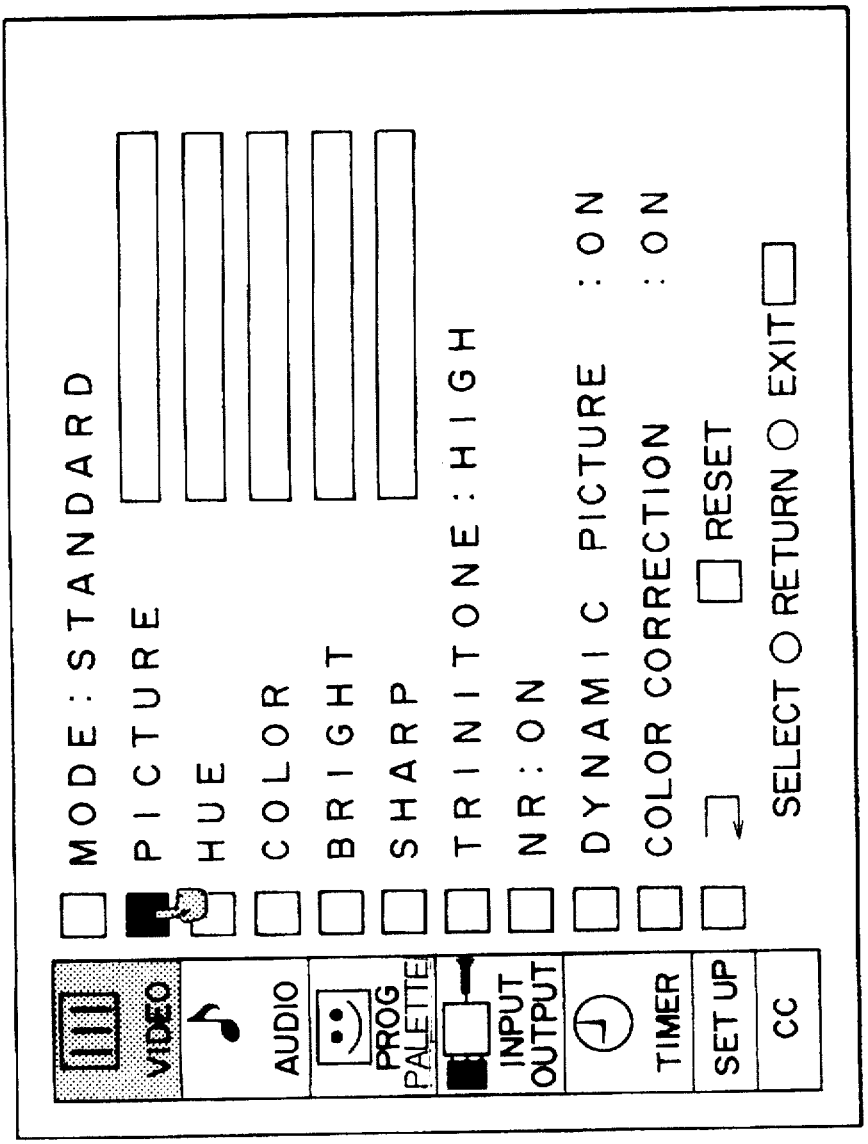
FIG. 14 is a schematic view showing an example of a menu screen when an item "PICTURE" of the item "VIDEO" of the main menu is designated.

FIG. 14 illustrates an example when the selection of the item "VIDEO" of the main menu is indicated and the pointer is moved to the item "PICTURE" of the sub menu corresponding to the item "VIDEO". Here, if the decision key 22 is depressed to indicated the selection of the item "PICTURE", then the adjustment values of the item "PICTURE" can be set.

Figure 15:
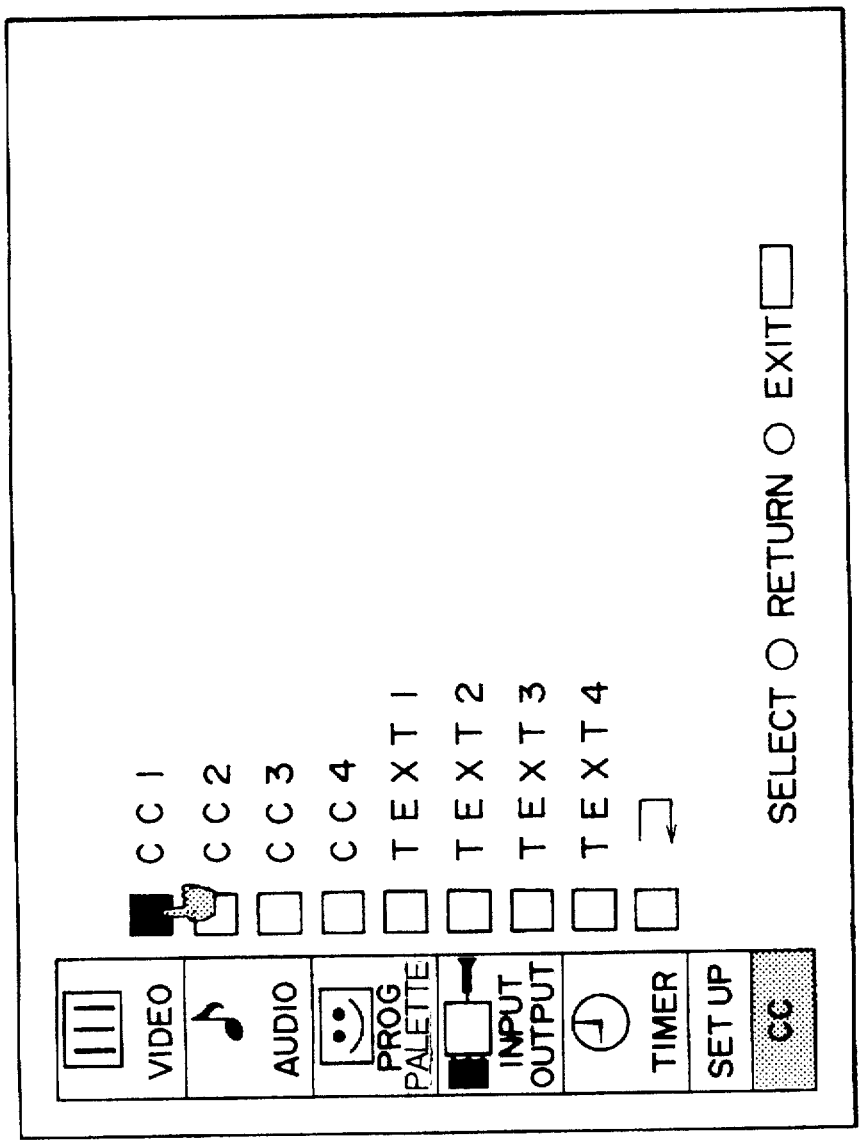
FIG. 15 is a schematic view showing an example of a menu screen when an item "CC1" of the item "CC" of the main menu is designated.

FIG. 15 illustrates an example when the selection of the item "CC" is indicated and the pointer is moved to the item "CC1" of the sub menu corresponding to the item "CC". Here, if the decision key 22 is depressed to indicate the selection of the item "CC1", then the television receiver is set so that a closed caption in a predetermined language corresponding to the item "CC1" may be displayed.

Figure 16:
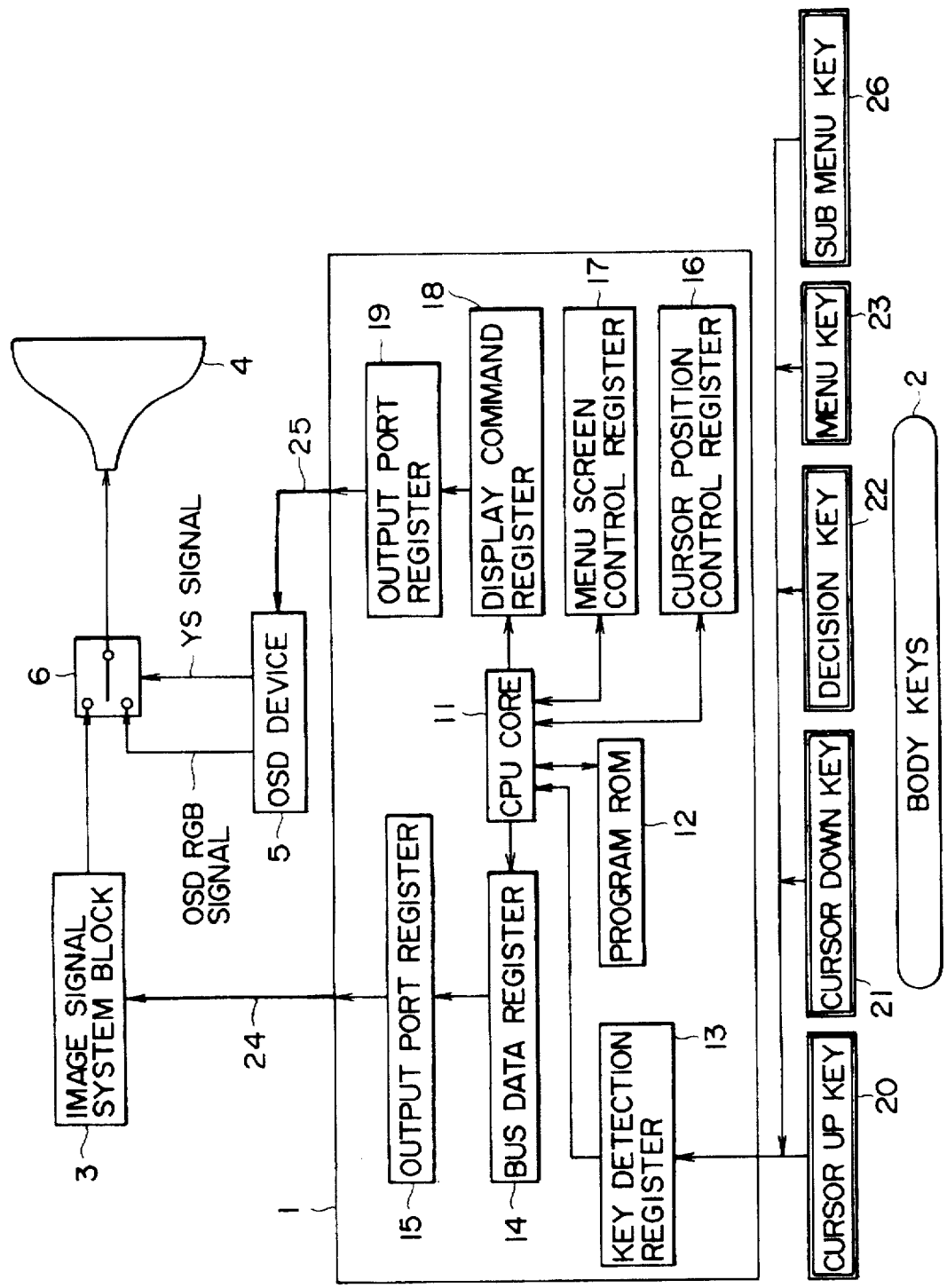
FIG. 16 is a block diagram showing a construction of another television receiver to which the present invention is applied.

FIG. 16 is a block diagram showing a construction of another television receiver to which a second embodiment of the present invention is applied. The television receiver of the present embodiment is a modification to and includes common components to those of the television receiver of the first embodiment described hereinabove with reference to FIG. 1, and accordingly, overlapping description of the common construction is omitted here to avoid redundancy. The television receiver of the present embodiment is different from the television receiver of the preceding embodiment only in that the body key apparatus 2 additionally includes a sub menu key 26 which can input an instruction to change over the display of a sub menu between on and off. If the sub menu key 26 is depressed, then corresponding key data is supplied to and stored into the key detection register 13. The key data is read out by the CPU core 11, and in response to the key data, if the display of a sub menu is currently set on, then the display of the sub menu is set to off, but if the display of a sub menu is currently set off, the display of the sub menu is set to on. Then, when it becomes necessary to re-write the screen as a result of the re-setting of the display of a sub menu, contents of the display command register 18 are re-written by the CPU core 11.

Figure 17:
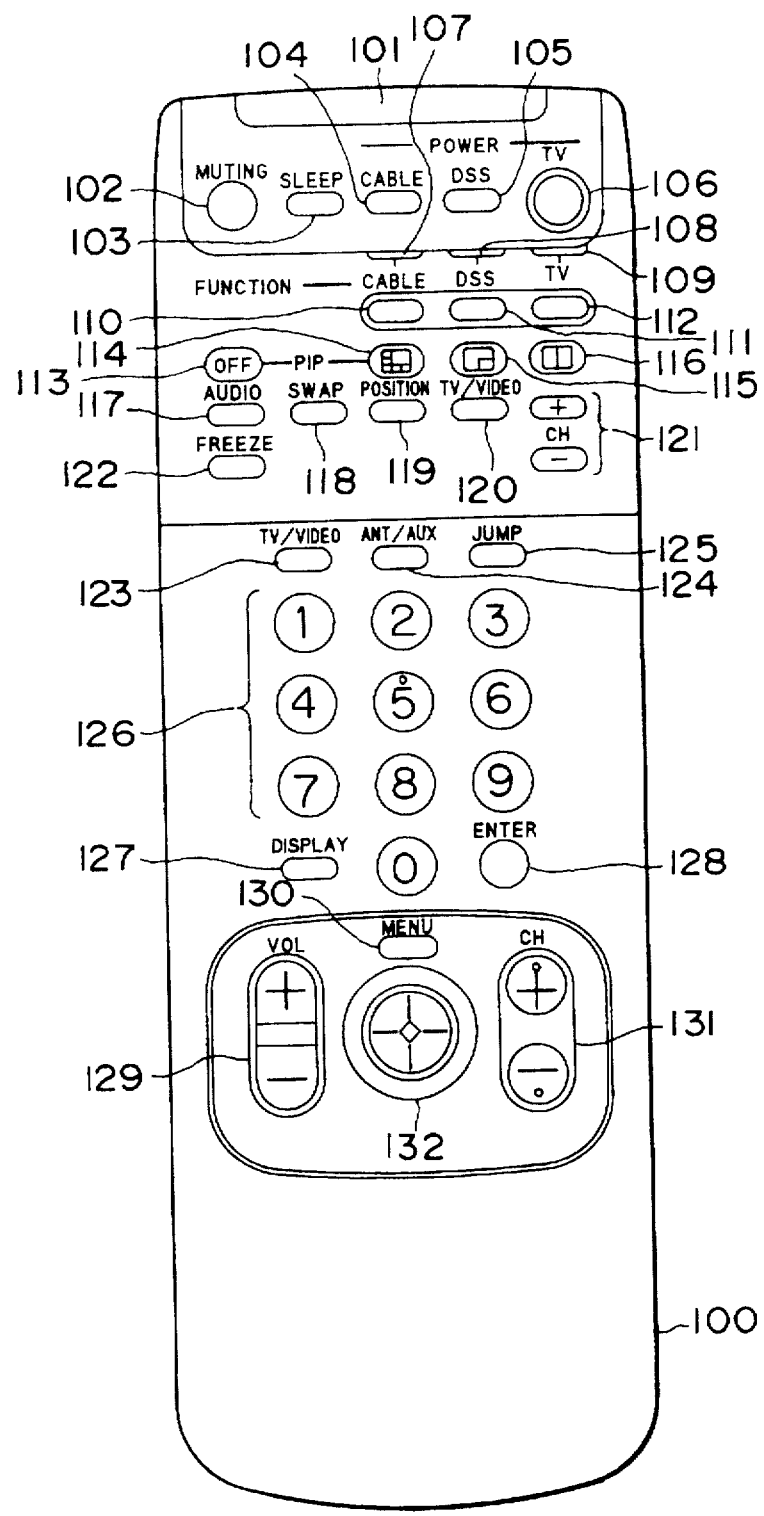
FIG. 17 is a schematic view showing an arrangement of buttons of a remote commander to which the present invention is applied.

FIG. 17 shows an example of a construction of a button switch arrangement of a remote commander which can be used to operate such a television receiver as shown in FIG. 1. A muting button switch 102 is manually operated to set or cancel a muting condition of the CRT 4. A sleep button switch 103 is manually operated to set or cancel a sleep mode in which the power supply is automatically interrupted when a predetermined point of time comes or when a predetermined time elapses.

When a cable power source button switch 104, a DSS (Digital Satellite System) power source button switch 105 and a television power source button switch 106 are manually operated, a cable box (not shown), a receiver (not shown) for receiving a DSS and the power source for the television receiver are switched off, respectively.

A cable button switch 110, a DSS button switch 111 and a television button switch 112 are button switches for changing over between functions, that is, for changing over between apparatus categories by transmitting a code of an infrared ray signal emitted from a light emitting element 101 of the remote commander 100. In particular, the cable button switch 110 is manually operated when a signal transmitted via a cable and received by the cable box is to be displayed on the CRT 4. In response to the manual operation of the cable button switch 110, a code of an apparatus category allocated to the cable box is emitted as an infrared ray signal. Similarly, the DSS button switch 111 is manually operated when a digital satellite broadcast received via an artificial satellite is to be displayed on the CRT 4. The television button switch 112 is manually operated when a signal received by the tuner (not shown) is to be displayed. LEDs 107, 108 and 109 are lit when the cable button switch 110, the DSS button switch 111 and the television button switch 112 are turned on, respectively. Consequently, it is indicated that, when a button is depressed, to an apparatus of which category a code is transmitted.

A PIP (picture-in-picture) display button switch 114, 115 or 116 is manually operated when a picture-in-picture screen is to be displayed at a predetermined position of the screen of the CRT 4. An OFF button switch 113 is manually operated when the display of a picture-in-picture displayed on the screen is to be ended. An AUDIO button switch 117 is manually operated when an audio output is to be changed over between sound corresponding to an image displayed on the picture-in-picture screen and sound corresponding to an image displayed on the ordinary screen.

A SWAP button switch 118 is manually operated when an ordinary screen and a picture-in-picture screen are to be swapped. A position button switch 119 is manually operated when the position of the screen at which a picture-in-picture screen is to be displayed is to be designated such as, for example, a right upper position, a right lower position, a left upper position or a left lower position of the screen. A television/video change-over button switch 120 is manually operated when a signal to be displayed on the picture-in-picture screen is to be changed over to a signal from the tuner built in the television receiver or to an input signal (from a VCR or the like) from a video input terminal. A channel up/down button switch 121 is manually operated when a channel to be displayed on the picture-in-picture screen is to be changed over. A FREEZE button switch 122 is manually operated when an image displayed on the picture-in-picture screen is to be changed to a still picture.

Another television/video change-over button switch 123 is manually operated when a signal to be displayed on the ordinary screen is to be changed over to the signal from the tuner built in the television receiver or to an input signal (from a VCR or the like) from the video input terminal. An antenna/AUX change-over button switch 124 is manually operated to change over an input between an antenna input and an AUX input.

A jump button switch 125 is manually operated to restore an original channel which was received prior to the changing over between the antenna input and the AUX input. Each of numeric button (ten key) switches 126 on which numerals from 0 to 9 are indicated is manually operated when a number indicated thereon is to be inputted. An enter button switch 128 is manually operated after manual operation of the numeric button switches 126 is completed in order to input ending of inputting of a number. When a channel is changed over, a banner including a number, a call sign (name), a logo and a main icon of the new channel is displayed, for example, for 3 seconds. Here, two banners are available including a banner of a simple construction which includes the elements mentioned above and another banner of a more detailed construction which includes, in addition to the elements mentioned above, a name and a broadcast starting time of a program, the present time and so forth. A display button switch 127 is manually operated when the type of a banner to be displayed is to be changed over.

A volume button switch 129 is manually operated when the volume of sound is to be increased or decreased. A menu button switch 130 (menu display instruction means) is manually operated when a menu screen is to be displayed on the CRT 4 or when such display of a menu screen is to be ended. A channel up/down button switch 131 is manually operated when the number of a broadcasting channel to be received is to be increased or decreased.

The select button 132 (designation means, lower menu display instruction means, first selection means, second selection means) not only can be manually operated (directional operation) totaling eight directions including upward, downward, leftward and rightward directions and four intermediate oblique directions, but also can be manually operated or depressed (operation for selection) in a vertical direction with respect to the top face of the remote commander 100.

Figure 18:
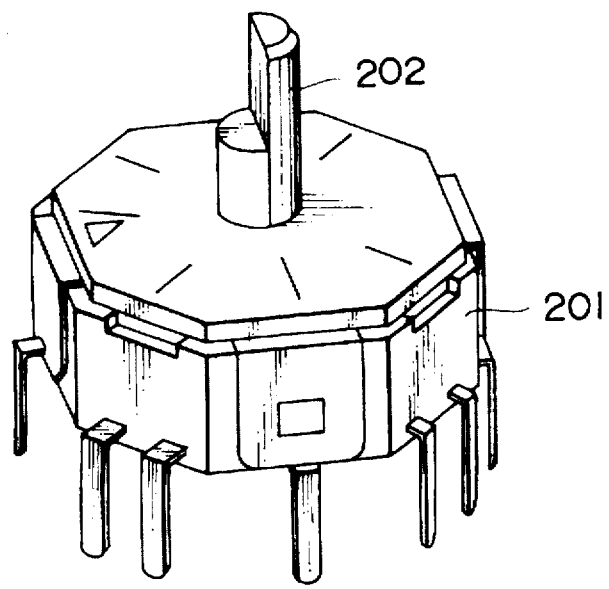
FIG. 18 is a perspective view showing a structure of a select button switch of the remote commander of FIG. 17.

FIG. 18 shows an example of a construction of a small stick switch which is used as the select button 132. The small stitch is so structured that a lever 202 extends from a body 201. When the select button 132 is directionally operated in one of the eight directions in a horizontal plane, it is pivoted in the operation direction. Further, when the select button 132 is manually operated for selection (operated vertically), the lever 202 is pushed down in a vertical direction.

Figure 19:
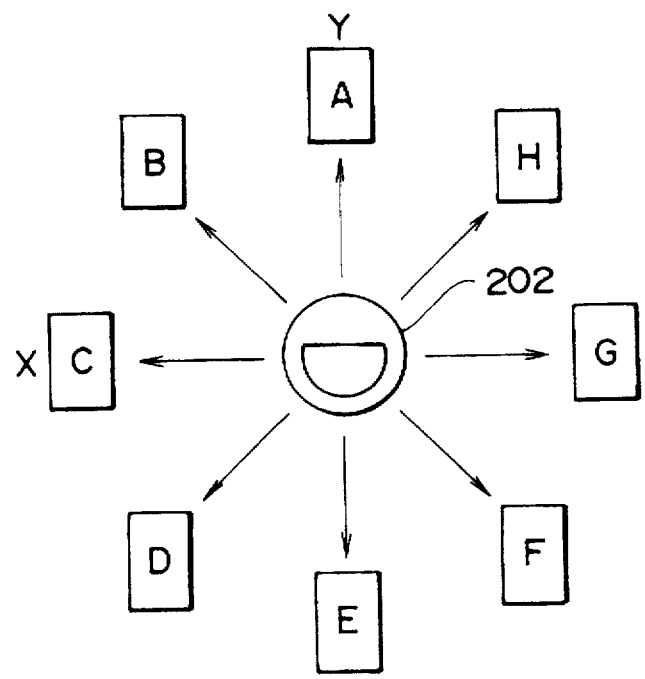
FIG. 19 is a diagrammatic view showing directions in which the select button switch of FIG. 18 can be moved.

FIG. 19 shows the eight operation directions of the lever 202 in a horizontal plane. As seen from FIG. 19, the lever 202 can be directionally operated in the eight directions indicated by A to H in the horizontal plane.

Figure 20:
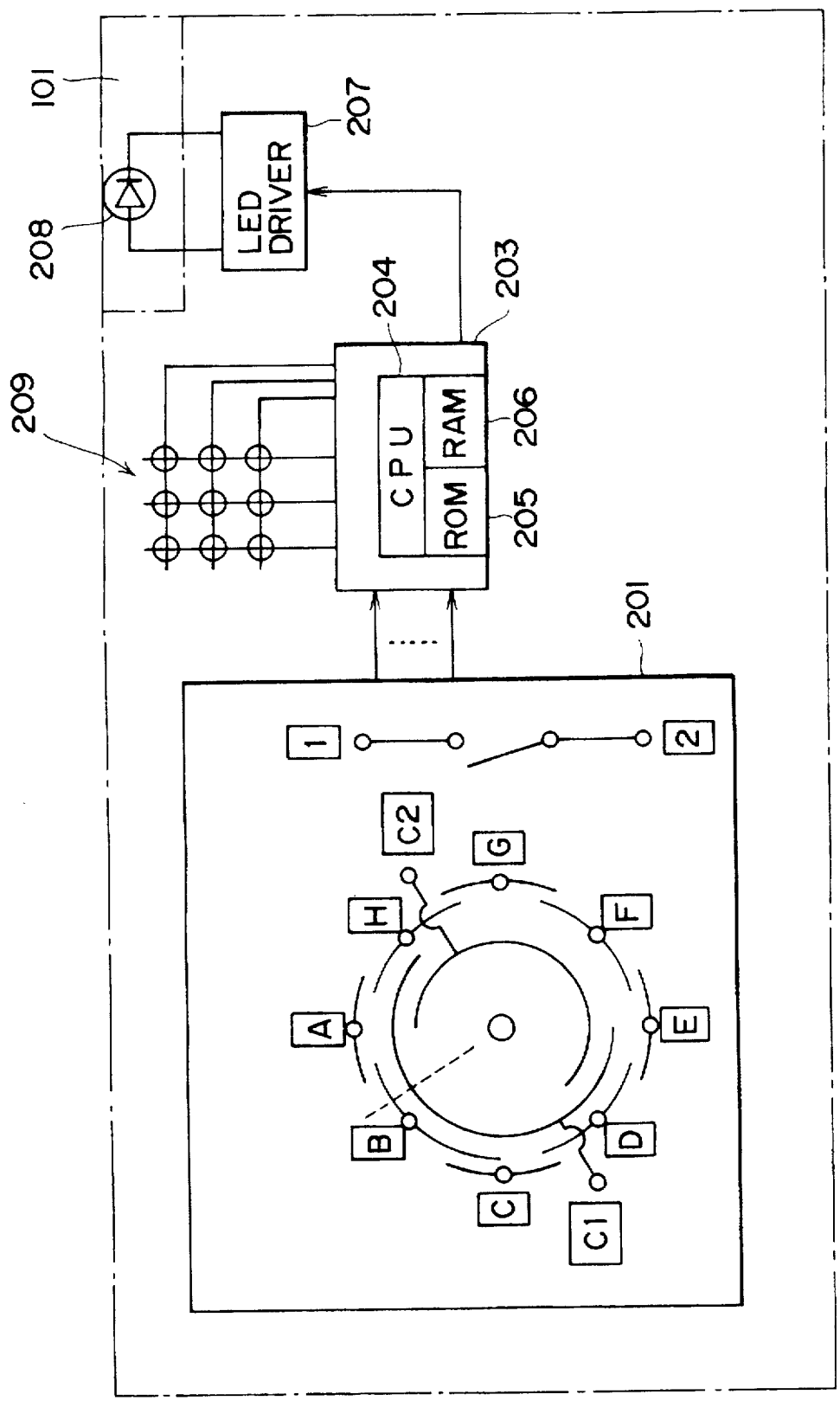
FIG. 20 is a block diagram showing an internal construction of the remote commander of FIG. 17.

FIG. 20 shows an example of an internal construction of the remote commander 100. Referring to FIG. 19, contacts A to H in the inside of the body 201 of the small stick switch correspond to the eight directions A to H shown in FIG. 19. When the lever 202 is manually operated in one of the directions A to D, a corresponding one of the contacts A to D is connected to a terminal C1. On the other hand, when the lever 202 is pivoted in one of the directions E to H, a corresponding one of the terminals E to H is connected to another terminal C2. Further, between the terminals H and A and between the terminals D and E, both of the terminals C1 and C2 are connected to them, respectively. Further, when the lever 202 is manually operated in a vertical direction, the terminals C1 and C2 are connected to each other.

The connection condition of the terminals of the body 201 is monitored by a CPU 204 of a microcomputer 203. Consequently, the CPU 204 can detect a directional operation and a selection operation of the select button 132.

Further, the CPU 204 always scans a button switch matrix 209 to detect a manual operation of any other button switch of the remote commander 100 shown in FIG. 17.

The CPU 204 executes various processing in accordance with a program stored in a ROM 205 and suitably stores necessary data into a RAM (Random Access Memory) 206.

When an infrared ray signal is to be outputted, the CPU 204 drives a LED 208 via a LED driver 207 so that an infrared ray signal may be outputted from the LED 208.

For example, if a menu button 130 is depressed, then a corresponding infrared ray signal is emitted from the light emitting element 101 and received by a light receiving element (not shown) of the television receiver shown in FIG. 1. The signal is supplied to the CPU core 11, by which a display command for displaying a predetermined menu screen is placed into the display command register 18. The display command placed in the display command register 18 is supplied to the OSD device 5 via the output port register 19 and the bus line 25. The OSD device 5 generates an RGB signal corresponding to the menu screen and a control signal in response to the display command supplied thereto and supplies the signals to the switch 6. The switch 6 supplies the RGB signal from the OSD device 5 or a video signal from the video signal system block 3 to the CRT 4 changing over them at a predetermined timing in response to the control signal from the OSD device 5. As a result, a menu screen is displayed on the screen of the CRT 4 in a superposed condition with a program of an ordinary television broadcast as show in FIG. 3.

At first, the cursor is positioned at the "ITEM 1" which is the first item of the main menu and the "ITEM 1" is displayed highlighted while a sub menu corresponding to the "ITEM 1" is simultaneously displayed. If the select button 132 is manually operated, in this condition, in a downward direction in FIG. 19, then the cursor moves to the position of the "ITEM 2" as seen in FIG. 4A and the "ITEM 2" is highlighted displayed. Further, a sub menu corresponding to the "ITEM 2" is simultaneously displayed. Then, if the select button 132 is manually operated in the downward direction again, then the cursor moves to the position of the "ITEM 3" and the "ITEM 3" is displayed highlighted while a sub menu corresponding to the "ITEM 3" is simultaneously displayed. In this manner, by manually operating the select button 132, a sub menu corresponding to any item of the main menu can be displayed.

If, for example, the select button 132 is manually operated to position the cursor at the "ITEM 1" and then manually operated in the vertical direction, then the selection of the "ITEM 1" is selected. As a result, the cursor moves to the first item "ITEM 1-1" among items forming a sub menu corresponding to the "ITEM 1" and the "ITEM 1-1" is displayed highlighted. Here, by manually operating the select button 132 in an upward or downward direction, the cursor can be positioned at a desired one of the items of the sub menu. Then, by manually operating the select button 132 in the vertical direction, the selection of the highlighted displayed item can be selected.

Further, when the display of a sub menu is to be set to on (to be displayed) or off (not to be displayed), for example, the item "ITEM 4" of the main menu in FIG. 3 is determined as an item for changing over between on/off of a sub menu display, and the select button 132 is manually operated to move the cursor to the item "ITEM 4" and then manually operated in the vertical direction to indicate the selection of the "ITEM 4". Consequently, the display of the sub menu is turned off.

As a result, even if the cursor is positioned at one of the items of the main menu and the item is displayed highlighted, a sub menu corresponding to the item is not displayed. In order to set the display of a sub menu to on, operation similar to that described hereinabove is performed so that the display of the sub menu can be set to on.

By setting the display of a sub menu to off, possible obstruction of it to enjoyment of a program of a television broadcast displayed on the screen can be minimized. Further, to a user who understands the menu structure well, elimination of an unnecessary display can improve the convenience for use.

Figure 21:
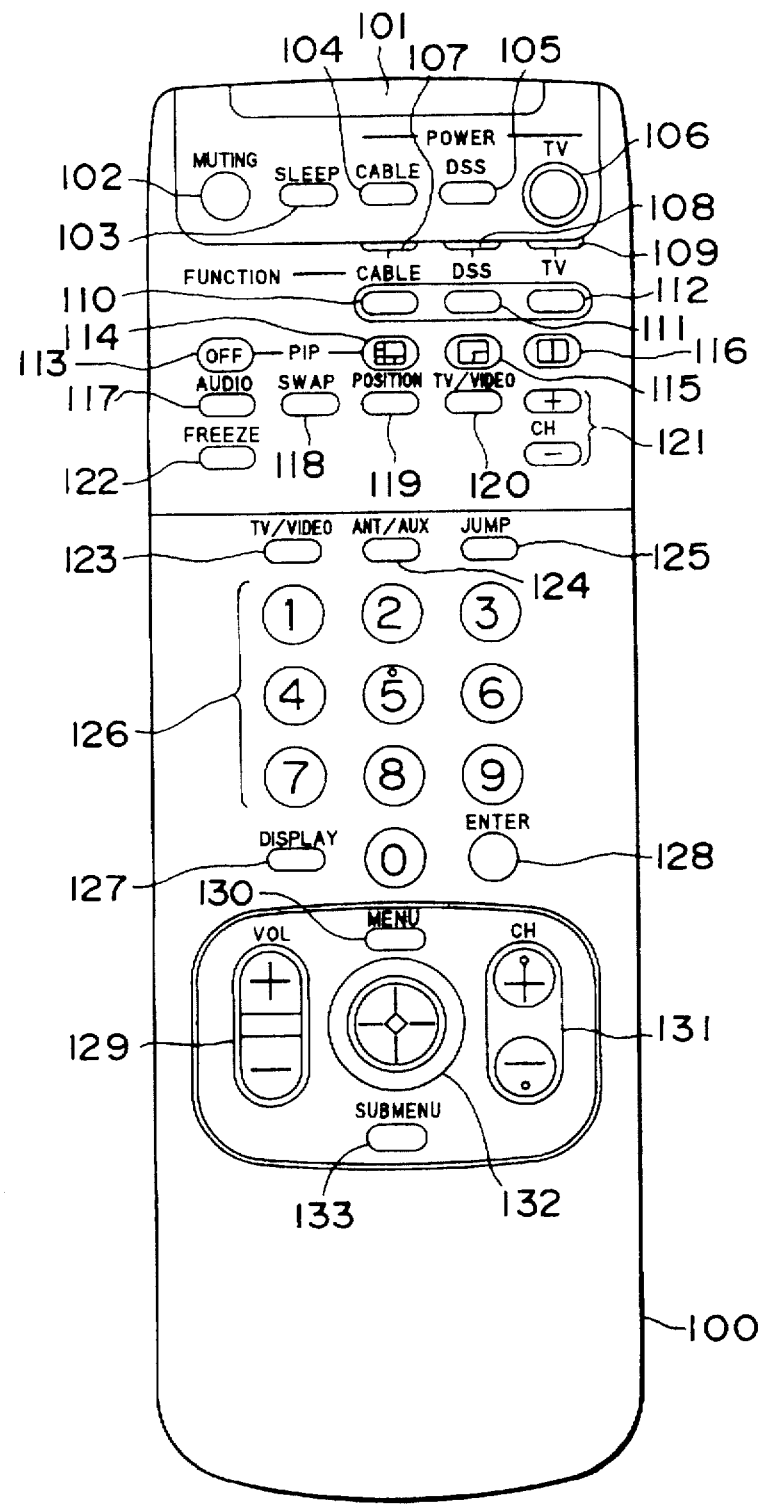
FIG. 21 is a schematic view showing an arrangement of buttons of another remote commander to which the present invention is applied.

FIG. 21 shows in schematic view another remote commander for a television receiver to which the present invention is applied. The present remote commander is a modification to and is basically common with the remote commander described hereinabove with reference to FIG. 17 in terms of the arrangement of buttons, the internal construction and the operation, and overlapping description thereof is omitted here to avoid redundancy. The present remote commander is different from the remote commander of FIG. 17 only in that it additionally includes a sub menu button 133 (lower menu display instruction means) for exclusive use for turning the display of a sub menu on or off. A user can set the display of a sub menu to on or off by depressing the sub menu button 133.

It is to be noted that, while the menu system in any of the television receivers of the embodiments described hereinabove includes two hierarchies of the main menu and sub menus, it may otherwise include an arbitrary number of hierarchies equal to or greater than 3. In this instance, menus of all hierarchies may be displayed on a screen or menus of only a predetermined number of ones of the hierarchies may be displayed on a screen.

Further, while the main menu in any of the television receivers of the embodiments described hereinabove is displayed on the left side portion of the screen while a sub menu is displayed on the right side portion of the screen, they may otherwise be displayed at other arbitrary positions.

Further, while, in any of the television receivers of the embodiments described above, items forming the main menu or a sub menu are arranged in a vertical column, they may otherwise be arranged in a horizontal row.

Further, while a sub menu on any of the television screens of the embodiments described above is displayed in the form of characters, it may otherwise be displayed in the form of button icons or the like.

Further, while the pointer displayed on any screen shown in the drawings is shown having the shape of a finger, it may have the shape of an arrow mark or may have any other arbitrary shape.

Having now fully described the invention, it will be apparent to one of ordinary skill in the art that many changes and modifications can be made thereto without departing from the spirit and scope of the invention as set forth herein.

What is claimed is:

1. A function selection method for a television receiver comprising the steps of:
- displaying a first level of a hierarchical menu in a first region of a screen of said television receiver, wherein a plurality of selection items corresponding to functions of said television receiver are displayed;
- designating one of said plurality of selection items from said first level of said hierarchical menu displayed on said screen of said television receiver;
- displaying a subordinate level of said hierarchical menu in a second region of said screen, wherein a plurality of control items corresponding to said designated selection item are displayed;
- selecting said designated selection item of said first level of said hierarchical menu;
- selecting one of said plurality of control items from said subordinate level of said hierarchical menu; and
- modifying said selected control item, whereby said functions of said television receiver corresponding to said designated selection item is controlled by modifying said selected control item.

2. The function selection method according to claim 1 wherein a number of levels of hierarchy of said hierarchical menu is equal to or greater than 2.

3. A function selection method for a television receiver comprising the steps of:
- displaying a first level of a hierarchical menu indicating a plurality of selection items corresponding to functions of said television receiver in a first region of a screen of said television receiver;
- designating one of said plurality of selection items from said first level of said hierarchical menu displayed on said screen of said television receiver;
- selecting said designated selection item;
- displaying a subordinate menu in a second region of said screen of said television receiver indicating further selection items corresponding to a further set of functions of said television receiver related to the designated selection item; and
- selecting one of the selection items from said subordinate menu, whereby said further set of selection items is used to control said further set of functions of said television receiver.

4. The function selection method according to claim 3, wherein said number of the hierarchies of said hierarchical menu is equal to or greater than 2.

5. A television receiver, comprising:
- menu display means for displaying selection items of a first level of a hierarchical menu which includes a plurality of selection items corresponding to functions of said television receiver in a first region of a screen of said television receiver;
- designation means for designating one of said selection items of said first hierarchical level of the menu displayed by said menu display means;
- subordinate menu display means for displaying a subordinate hierarchical level of said menu which includes a plurality of control items for controlling a function corresponding to said designated selection item of said first hierarchical level in a second region of said screen of said television receiver;
- first selection means for selecting said selection item designated by said designation means;
- second selection means for selecting one of said plurality of control items from said subordinate menu related to said selection item selected by said first selection means; and
- modifying means for modifying said control item, whereby said functions of said television receiver corresponding to said selected selection item is modified.

6. The television receiver according to claim 5 wherein a number of hierarchical levels of said menu is equal to or greater than 2.

7. The television receiver according to claim 5 further comprising a setting means responsive to said menu display means for preventing said subordinate menu display means from displaying said subordinate hierarchical level of said menu.

8. A remote commander for a television receiver comprising:
- menu display instruction means for causing said television receiver to display a first level of a hierarchical menu in a first region of a screen of said television receiver, wherein selection items of said first level of said hierarchical menu correspond to functions of said television receiver and, wherein at least one subordinate hierarchical level of said menu corresponds to control of said functions of said television receiver;
- designation means for causing said television receiver to designate one of said selection items of said first hierarchical level of said menu displayed by said television receiver in response to said menu display instruction means;
- subordinate menu display instruction means for causing said television receiver to display said subordinate hierarchical level in a second region of said screen of said television receiver while said selection items of said first hierarchical level of said menu are displayed in said first region of said screen in response to the instruction of said menu display instruction means, wherein said control functions of said subordinate level of said menu correspond to designated selection items of said first level of said menu;
- first selection means for selecting said selection item designated by said designation means; and
- second selection means for selecting one of said control functions of said subordinate menu.

9. The remote commander for a television receiver according to claim 8 wherein a number of the hierarchies of said menu is equal to or greater than 2.

10. The function selection method according to claim 1 wherein said first and second screen regions do not overlap.

11. The function selection method according to claim 3 wherein said first and second screen regions do not overlap.

12. The television receiver according to claim 5 wherein said first and second screen regions do not overlap.

13. The remote commander according to claim 8 wherein said first and second screen regions do not overlap.

* * * * *